(12) United States Patent
Burns et al.

(10) Patent No.: US 9,786,554 B1
(45) Date of Patent: Oct. 10, 2017

(54) SELF ALIGNED CONDUCTIVE LINES

(71) Applicant: INTERNATIONAL BUSINESS MACHINES CORPORATION, Armonk, NY (US)

(72) Inventors: Sean D. Burns, Hopewell Junction, NY (US); Lawrence A. Clevenger, LaGrangeville, NY (US); Anuja E. DeSilva, Slingerlands, NY (US); Nelson M. Felix, Briarcliff Manor, NY (US); Sivananda K. Kanakasabapathy, Niskayuna, NY (US); Yann A. M. Mignot, Slingerlands, NY (US); Christopher J. Penny, Saratoga Springs, NY (US); Roger A. Quon, Rhinebeck, NY (US); Nicole A. Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/176,284

(22) Filed: Jun. 8, 2016

(51) Int. Cl.
*H01L 21/768* (2006.01)
*H01L 23/528* (2006.01)

(52) U.S. Cl.
CPC .. *H01L 21/76877* (2013.01); *H01L 21/76802* (2013.01); *H01L 21/76829* (2013.01);
(Continued)

(58) Field of Classification Search
CPC combination set(s) only.
See application file for complete search history.

(56) References Cited

U.S. PATENT DOCUMENTS

| 7,517,637 B2 | 4/2009 | Colburn et al. |
| 8,415,089 B1 | 4/2013 | Gupta et al. |

(Continued)

FOREIGN PATENT DOCUMENTS

WO  2015047321 A1  4/2015

OTHER PUBLICATIONS

List of IBM Patents or Patent Applications Treated as Related; (Appendix P), Filed Jun. 13, 2016, 2 pages.
(Continued)

*Primary Examiner* — Kyoung Lee
*Assistant Examiner* — Ratisha Mehta
(74) *Attorney, Agent, or Firm* — Cantor Colburn LLP; Vazken Alexanian

(57) ABSTRACT

A method for forming conductive lines on a wafer comprises forming a first hardmask, a planarizing layer, a second hardmask, a layer of sacrificial mandrel material on the second hardmask, and patterning a mask on the layer of sacrificial material. A first sacrificial mandrel and a second sacrificial mandrel and a gap are formed. A layer of spacer material is deposited in the gap. Portions of the first sacrificial mandrel and the second sacrificial mandrel are removed, and exposed portions of the second hardmask, the planarizing layer and the first hardmask are removed to expose portions of the insulator layer. The second hardmask, the spacers, and the planarizing layer are removed. Exposed portions of the insulator layer are removed to form a trench in the insulator layer, and the trench is filled with a conductive material.

7 Claims, 62 Drawing Sheets

(52) U.S. Cl.
 CPC .. *H01L 21/76843* (2013.01); *H01L 21/76816* (2013.01); *H01L 21/76897* (2013.01); *H01L 23/528* (2013.01)

(56) References Cited

U.S. PATENT DOCUMENTS

| | | |
|---|---|---|
| 8,461,678 B2 | 6/2013 | Edelstein et al. |
| 8,889,561 B2 | 11/2014 | Woo et al. |
| 8,907,497 B2 | 12/2014 | Chang et al. |
| 9,064,813 B2 | 6/2015 | Kanakasabapathy et al. |
| 9,196,485 B2 | 11/2015 | Leobandung |
| 2009/0206489 A1 | 8/2009 | Li et al. |
| 2014/0024219 A1* | 1/2014 | Jung ............... H01L 21/0337 438/703 |
| 2014/0187047 A1* | 7/2014 | Tagami ............ H01L 21/0276 438/703 |
| 2015/0035081 A1 | 2/2015 | Cheng et al. |
| 2015/0255300 A1 | 9/2015 | He et al. |
| 2015/0372107 A1 | 12/2015 | Liu et al. |
| 2015/0380300 A1 | 12/2015 | Wu et al. |

OTHER PUBLICATIONS

Sean D. Burns, et al., "Self Aligned Conductive Lines", U.S. Appl. No. 15/176,279, filed Jun. 8, 2016.
Sean D. Burns, et al., "Self Aligned Conductive Lines", U.S. Appl. No. 15/176,286, filed Jun. 8, 2016.

\* cited by examiner

SELF ALIGNED CONDUCTIVE LINES

BACKGROUND

The present invention generally relates to complimentary metal-oxide semiconductors (CMOS) and metal-oxide-semiconductor field-effect transistors (MOSFET), and more specifically relates to conductive lines used in semiconductor devices.

The MOSFET is a transistor used for switching electronic signals. The MOSFET has a source, a drain, and a gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are largely determined by the wavelength of the irradiation.

SUMMARY

According to an embodiment of the present invention, a method for forming conductive lines on a semiconductor wafer comprises forming a first hardmask on an insulator layer, a planarizing layer on the first hardmask, a second hardmask on the planarizing layer and a layer of sacrificial mandrel material on the second hardmask, and patterning a mask on the layer of sacrificial material. A portion of the mask is removed. Exposed portions of the layer of sacrificial mandrel material are removed to expose portions of the second hardmask and form a first sacrificial mandrel and a second sacrificial mandrel on the second hardmask, wherein the first sacrificial mandrel has a gap defined by a first portion of the first sacrificial mandrel and a second portion of the first sacrificial mandrel. A filler material is deposited on the second hardmask between the first sacrificial mandrel and the second sacrificial mandrel. A portion of the filler material between the first sacrificial mandrel and the second sacrificial mandrel is removed to expose a portion of the second hardmask. An exposed portion of the second hardmask and an exposed portion of the planarizing layer are removed to form a cavity that exposes a portion of the first hardmask. The filler material is removed. A layer of spacer material is deposited in the gap, the cavity, and over exposed portions of the first sacrificial mandrel, the second sacrificial mandrel and the first hardmask. Portions of the layer of spacer material are removed to form spacers adjacent to the first sacrificial mandrel and the second sacrificial mandrel, and expose portions of the second hardmask. Exposed portions of the second hardmask, the planarizing layer and the first hardmask are removed to expose portions of the insulator layer. The second hardmask, the spacers, and the planarizing layer and exposed portions of the insulator layer are removed to form a trench in the insulator layer. The trench is filled with a conductive material.

According to another embodiment of the present invention, a method for forming conductive lines on a semiconductor wafer, comprises forming a first hardmask on an insulator layer, a planarizing layer on the first hardmask, a second hardmask on the planarizing layer, a layer of sacrificial mandrel material on the second hardmask, and patterning a mask on the layer of sacrificial material. The method further includes removing exposed portions of the layer of sacrificial mandrel material to expose portions of the second hardmask and form a first sacrificial mandrel and a second sacrificial mandrel on the second hardmask, wherein the first sacrificial mandrel has a gap defined by a first portion of the first sacrificial mandrel and a second portion of the first sacrificial mandrel. A layer of spacer material is deposited in the gap, and over exposed portions of the first sacrificial mandrel, the second sacrificial mandrel and the second hardmask. A filler material is deposited on the layer of spacer material. Portions of the layer of spacer material and the filler material are removed to expose portions of the first sacrificial mandrel and the second sacrificial mandrel. A second filler material is deposited on the layer of spacer material. A mask is patterned over a portion of the second filler material. Exposed portions of the second filler material are removed. The second filler material, the first sacrificial mandrel and the second sacrificial mandrel are removed to expose portions of the second hardmask. Exposed portions of the second hardmask, the planarizing layer and the first hardmask are removed to expose portions of the insulator layer. The second hardmask, the spacers, and the planarizing layer and exposed portions of the insulator layer are removed to form a trench in the insulator layer. The trench is filled with a conductive material.

According to yet another embodiment of the present invention, a method for forming conductive lines on a semiconductor wafer comprises forming a first hardmask on an insulator layer, a planarizing layer on the first hardmask, a second hardmask on the planarizing layer and patterning a mask on the second hardmask. The exposed portions of the second hardmask are removed to expose portions of the planarizing layer. A third hardmask is deposited over the second hardmask and exposed portions of the planarizing layer. A layer of sacrificial mandrel material over the third hardmask and a fourth hardmask is formed on the layer of sacrificial mandrel material. A portion of the fourth hardmask is removed to expose a portion of the layer of sacrificial mandrel material. A mask is patterned on portions of the fourth hardmask and the layer of sacrificial mandrel material. Exposed portions of the fourth hardmask are removed to expose portions of the layer of sacrificial mandrel material. Exposed portions of the layer of sacrificial mandrel material are removed to expose portions of the third hardmask and form a first sacrificial mandrel and a second sacrificial mandrel on the third hardmask, wherein the first sacrificial mandrel has a gap defined by a first portion of the first sacrificial mandrel and a second portion of the first sacrificial mandrel. A layer of spacer material is deposited in the gap, and over exposed portions of the first sacrificial mandrel, the second sacrificial mandrel, the third hardmask, and the second hardmask. Portions of the layer of spacer material are removed to expose portions of the first sacrificial mandrel and the second sacrificial mandrel and form spacers adjacent to the first sacrificial mandrel and the second sacrificial mandrel. A filler material is deposited over the layer of spacer material, the first sacrificial mandrel, and the second sacrificial mandrel. Portions of the filler material are exposed to expose portions of the first sacrificial mandrel and the second sacrificial mandrel. The first sacrificial mandrel and the second sacrificial mandrel and exposed portions of the third hardmask and the second hardmask are removed. Exposed portions of the planarizing layer are removed to expose portions of the first hardmask. The layer of spacer material and exposed portions of the first hardmask are removed to expose portions of the insulator material. The second hardmask and the planarizing layer are removed. Exposed portions of the insulator layer are removed to form a trench in the insulator layer, and the trench is filled with a conductive material.

BRIEF DESCRIPTION OF THE DRAWINGS

FIGS. 1-19B illustrate an exemplary embodiment of a method for forming conductive lines for a semiconductor device.

FIG. 1 illustrates a side view of a structure formed on a substrate.

FIG. 5 illustrates a cut-away view following the formation of non-mandrel lines over exposed portions of the second hardmask.

FIG. 7 illustrates a cut-away view following a selective etching process that removes exposed portions of the non-mandrel lines.

FIG. 8 illustrates a cut-away view following another selective etching process that further increases the depth of the cavity.

FIG. 11 illustrates a cut-away view following the formation of spacers along sidewalls of the sacrificial mandrels.

FIG. 13 illustrates a cut-away view following a selective etching process that removes exposed portions of the underlying second hardmask.

FIG. 14 illustrates a cut-away view following a selective anisotropic etching process that removes exposed portions of the organic planarization layer.

FIG. 15 illustrates a cut-away view following another selective anisotropic etching process that removes exposed portions of the first hardmask.

FIG. 17 illustrates a cut-away view following a selective etching process.

FIG. 18 illustrates a cut-away view following the deposition of a conductive material.

FIG. 19B illustrates a top view of the resultant structure following the formation of the conductive lines.

FIGS. 20A-36B illustrate another exemplary embodiment of a method for forming conductive lines for a semiconductor device.

FIG. 20A illustrates a side view of a structure formed on a substrate.

FIG. 22 illustrates a cut-away view following the deposition of a layer of spacer material.

FIG. 23 illustrates a cut-away view following the deposition of a mask over exposed portions of the layer of spacer material.

FIG. 25 illustrates a cut-away view following the removal of the mask (of FIG. 24A) to expose portions of the spacers.

FIG. 27 illustrates a cut-away view following a selective anisotropic etching process that removes exposed portions of the non-mandrel line.

FIG. 30 illustrates a cut-away view following a selective etching process that removes exposed portions of the underlying second hardmask.

FIG. 31 illustrates a cut-away view following a selective anisotropic etching process that removes exposed portions of the organic planarization layer.

FIG. 32 illustrates a cut-away view following another selective anisotropic etching process that removes exposed portions of the first hardmask.

FIG. 34 illustrates a cut-away view following a selective etching process.

FIG. 35 illustrates a cut-away view following the deposition of a conductive material.

FIG. 36B illustrates a top view of the resultant structure following the formation of the conductive lines.

FIGS. 37A-59B illustrate another exemplary embodiment of a method for forming conductive lines for a semiconductor device.

FIG. 37A illustrates a cut-away view along the line A-A (of FIG. 37B) of a structure formed on a substrate.

FIG. 38 illustrates a cut-away view following a selective anisotropic etching process that removes exposed portions of the second hardmask.

FIG. 40 illustrates a cut-away view following a selective etching process that removes exposed portions of the fourth hardmask.

FIG. 42 illustrates a cut-away view following a selective etching process that removes exposed portions of the fourth hardmask.

FIG. 45 illustrates a cut-away view following the formation of spacers 4502 along sidewalls of the sacrificial mandrels.

FIG. 46 illustrates a cut-away view following the deposition of another organic planarizing layer over portions of the spacers.

FIG. 47 illustrates a cut-away view following the removal of portions of the organic planarizing layer to expose portions of the sacrificial mandrels.

FIG. 48 illustrates a cut-away view following the removal of the sacrificial mandrels.

FIG. 49 illustrates a cut-away view following a selective anisotropic etching process that removes exposed portions of the third hardmask.

FIG. 50 illustrates a cut-away view of the resultant structure following a selective etching process.

FIG. 51 illustrates a cut-away view following a selective etching process that removes exposed portions of the organic planarizing layer.

FIG. 52 illustrates a cut-away view following another selective etching process that removes portions of the layer of spacer material.

FIG. 53 illustrates a cut-away view following a selective etching process.

FIG. 54 illustrates a cut-away view following the removal of the spacers.

FIG. 55 illustrates a cut-away view following a selective etching process that removes exposed portions of the second hardmask.

FIG. 56 illustrates a cut-away view following the removal of exposed portions of the organic planarizing layer to expose the first hardmask.

FIG. 57 illustrates a cut-away view following a selective etching process.

FIG. 58 illustrates a cut-away view following the deposition of a conductive material.

FIG. 59B illustrates a top view of the resultant structure following the formation of the conductive lines.

DETAILED DESCRIPTION

Conductive connections in semiconductor devices and integrated circuits often include conductive lines that are arranged in trenches formed in an insulating material. The conductive lines connect to devices in the circuit. Integrated circuits often have multiple layers of devices and conductive lines arranged on one or more wafers. Conductive vias are used to form electrical connections between different layers of an integrated circuit.

As the scale of semiconductor devices continues to decrease, aligning and patterning conductive lines in desired locations on the chip continues to become more challenging. Typically, in an integrated circuit having trenches filled with conductive material to form conductive lines, it is desirable to pattern the trenches using a self-alignment method to avoid misalignments. As the pitch of the trenches or lines scales down, the use of previous patterning methods has not resulted in a desired trench alignment.

The embodiments described herein provide for a method for patterning that distinguishes mandrel lines and non-mandrel lines on device during the formation of the conductive lines. The method allows vias to be selectively formed on either mandrel or non-mandrel lines.

FIGS. 1-19B illustrate an exemplary embodiment of a method for forming conductive lines for a semiconductor device.

Figure 1:
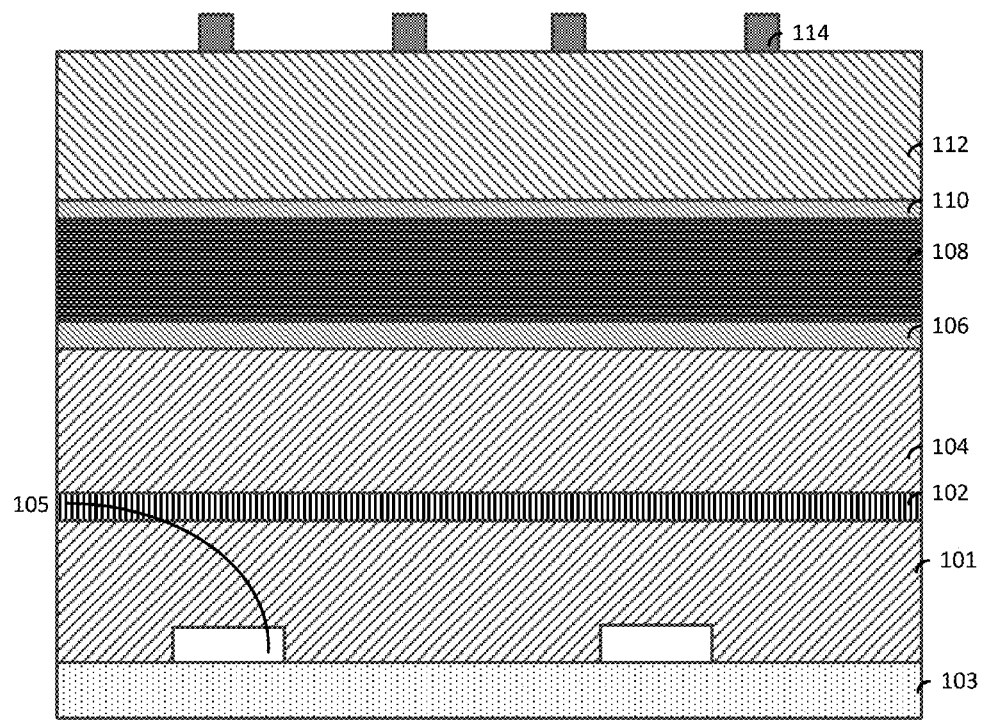

FIG. 1 illustrates a side view of a structure formed on a substrate 103. The substrate may include, for example, any suitable semiconductor material.

Non-limiting examples of suitable materials for the semiconductor layer 103 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

Semiconductor devices 105 are arranged on the substrate 103. The semiconductor devices 105 may include, for example, MOSFET or other types of electronic devices. A layer of insulating material 101 such as, for example, an oxide material is arranged over the substrate 103 and the semiconductor devices 105. A conductive line 102 is arranged on the layer of insulating material 101. The conductive line 102 may include a conductive metallic material such as, for example, copper, aluminum, silver, gold, or another suitable conductive material.

One or more of the semiconductor devices 105 may be electrically connected to the conductive line 102. In the illustrated exemplary embodiments described herein a method for forming conductive lines that may connect with vias to the underlying conductive line 102 will be described.

FIG. 1 further includes an inter-level dielectric layer (insulator layer) 104 arranged on the conductive line 102. In the illustrated exemplary embodiment, the insulator layer 104 is an inter-level dielectric layer.

The inter-level dielectric layer 104 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 104 is deposited by a deposition process, including, but not limited to CVD, PVD, plasma enhanced CVD, atomic layer deposition (ALD), evaporation, chemical solution deposition, or like processes. Following the deposition of the inter-level dielectric layer 104, a planarization process such as, for example, chemical mechanical polishing is performed.

A first hardmask 106 is arranged on the inter-level dielectric layer 104. The first hardmask 106 may include, for example, titanium nitride, silicon oxide, silicon nitride (SiN), SiOCN, SiBCN or any suitable combination of those. The first hardmask 106 may be deposited using a deposition process, including, but not limited to, PVD, CVD, PECVD, or any combination thereof.

An organic planarization layer (OPL) 108 is arranged on the first hardmask 106. The OPL 108 may be deposited by, for example, a spin-on process followed by a bake.

A second hardmask 110 is arranged on the organic planarization layer 108. The second hardmask 110 in the illustrated embodiment is similar to the first hardmask 106 however, in alternate exemplary embodiments, the first hardmask 106 and the second hardmask 110 may include dissimilar materials respectively.

A sacrificial mandrel layer 112 is arranged on the second hardmask 110. The sacrificial mandrel layer 112 in the illustrated exemplary embodiment includes an amorphous silicon material, alternate exemplary embodiments may include other materials such as, for example, an amorphous carbon material or a nitride material such as silicon nitride or titanium nitride.

A resist 114 is patterned on the sacrificial mandrel layer 112. Suitable resist masks include photoresists, electron-beam resists, ion-beam resists, X-ray resists and etch resists. The resist may a polymeric spin on material or a polymeric material.

Figure 2A:
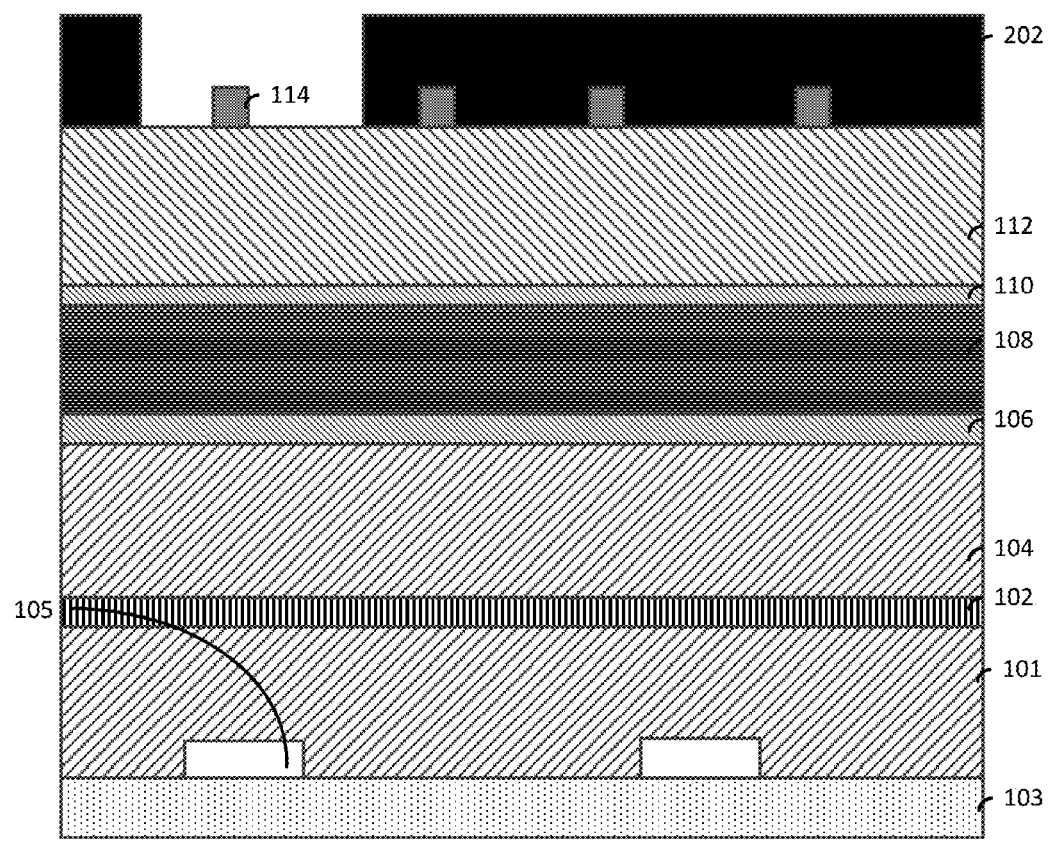
FIG. 2A illustrates a cut-away view along the line A-A (of FIG. 2B) following the patterning of a photolithographic mask on the sacrificial mandrel layer.

FIG. 2A illustrates a cut-away view along the line A-A (of FIG. 2B) following the patterning of a photolithographic mask 202 that is patterned on the sacrificial mandrel layer 112.

Figure 2B:
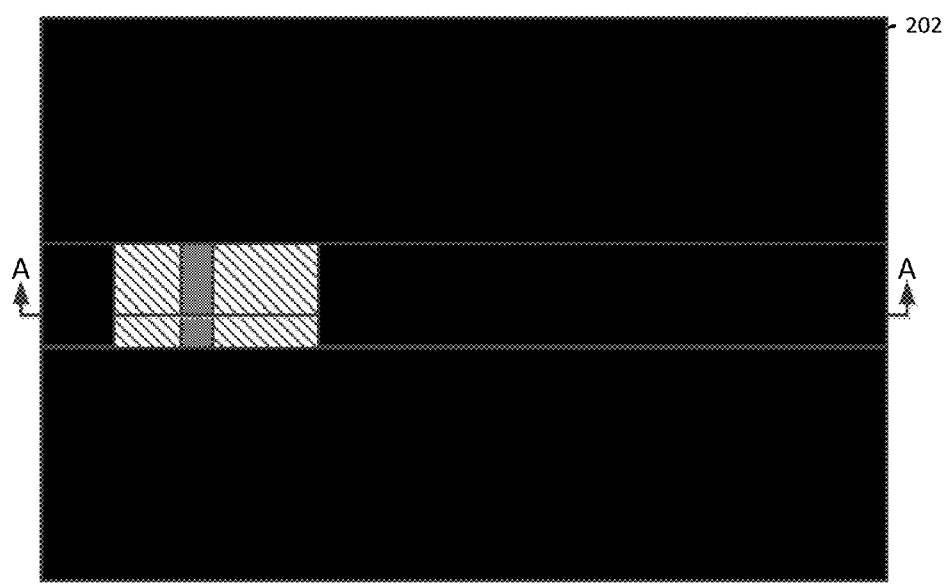
FIG. 2B illustrates a top view of the mask arranged on the sacrificial mandrel layer.

FIG. 2B illustrates a top view of the mask 202 arranged on the sacrificial mandrel layer 112.

Figure 3A:
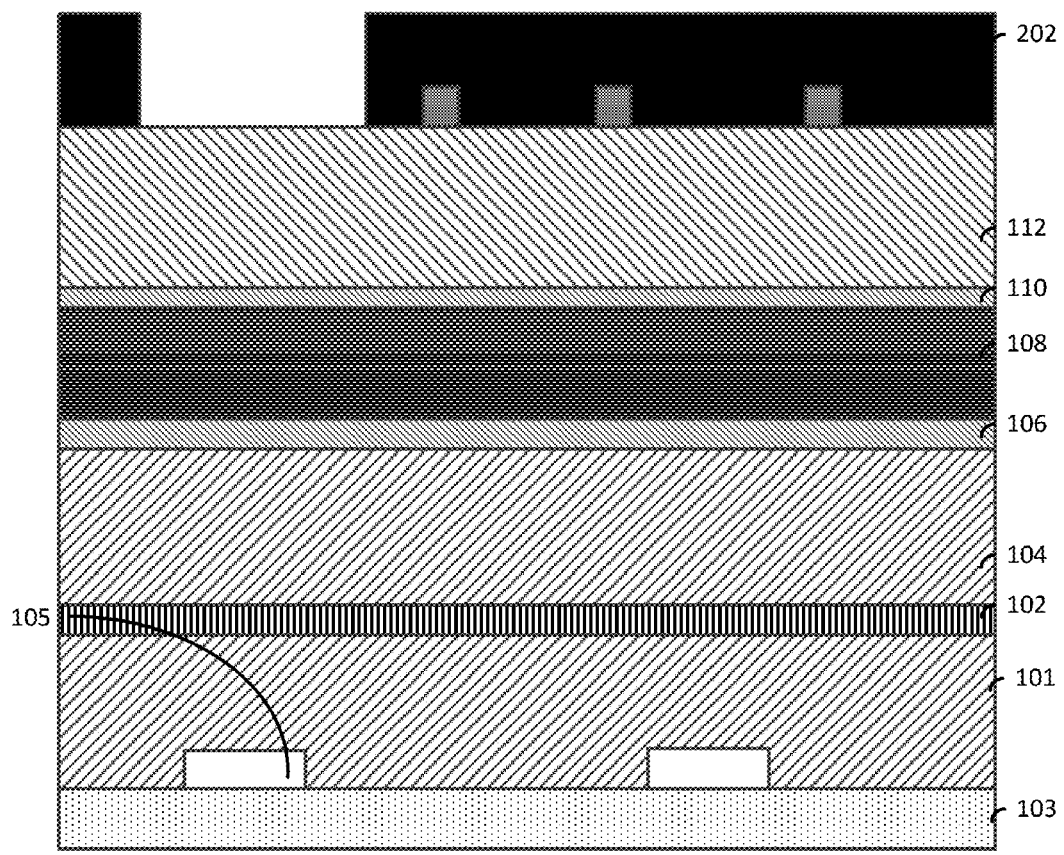
FIG. 3A illustrates a cut-away view along the line A-A (of FIG. 3B) following a selective etching process.
Figure 3B:
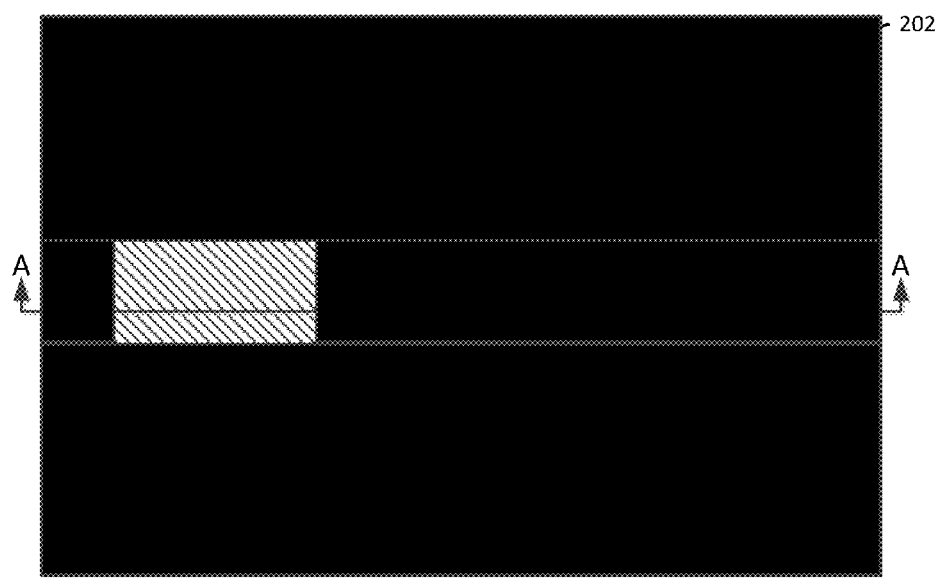
FIG. 3B illustrates a top view of the resultant structure following the etching process.

FIG. 3A illustrates a cut-away view along the line A-A (of FIG. 3B) following a selective etching process such as, for example, reactive ion etching that removes exposed portions of the resist 114. FIG. 3B illustrates a top view of the resultant structure following the etching process.

Figure 4A:
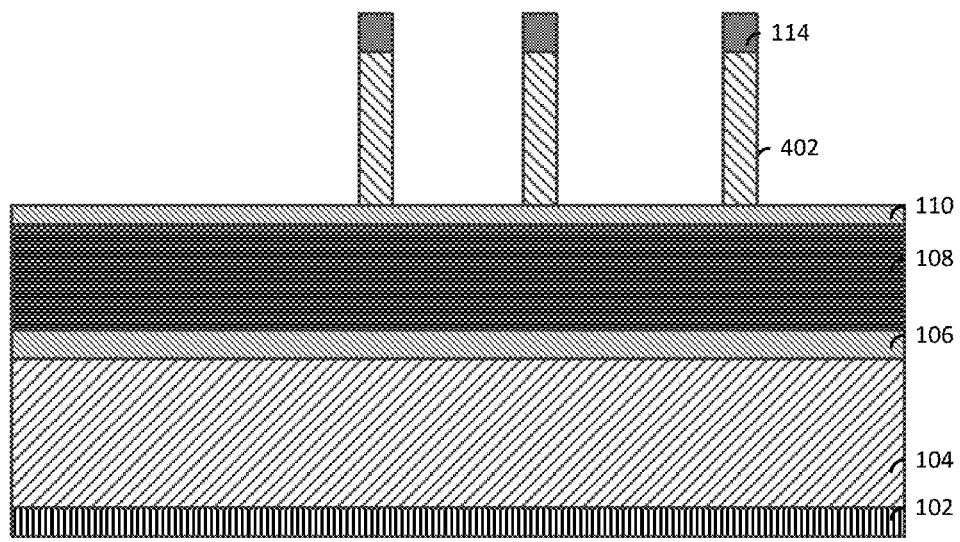
FIG. 4A illustrates a cut-away view along the line A-A (of FIG. 4B) following the removal of the mask.

FIG. 4A illustrates a cut-away view along the line A-A (of FIG. 4B) following the removal of the mask 202 (of FIG. 3A) using a process such as, for example, ashing. The ashing process may be used to remove a photoresist material, amorphous carbon, or organic planarization (OPL) layer. Ashing is performed using a suitable reaction gas, for example, O2, N2, H2/N2, O3, CF4, or any combination thereof.

Figure 4B:
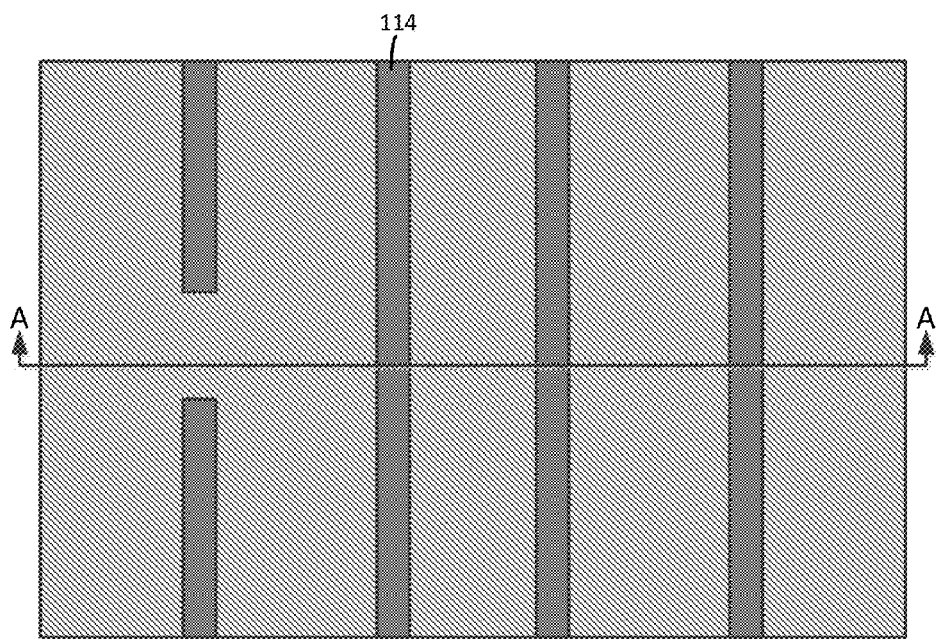
FIG. 4B illustrates a top view following the formation of the sacrificial mandrels.

Following the removal of the mask 202, sacrificial mandrels 402 are formed. The mandrels 402 are formed by performing an etching process such as, for example, reactive ion etching that selectively removes exposed portions of the sacrificial mandrel layer 112 to expose portions of the second hardmask 110 and form sacrificial mandrels (mandrel lines) 402. For simplicity and illustrative purposes, the substrate 103, the semiconductor devices 105, and the insulator layer 101 have been omitted from FIG. 2 and subsequent figures. FIG. 4B illustrates a top view following the formation of the sacrificial mandrels 402

Figure 5:
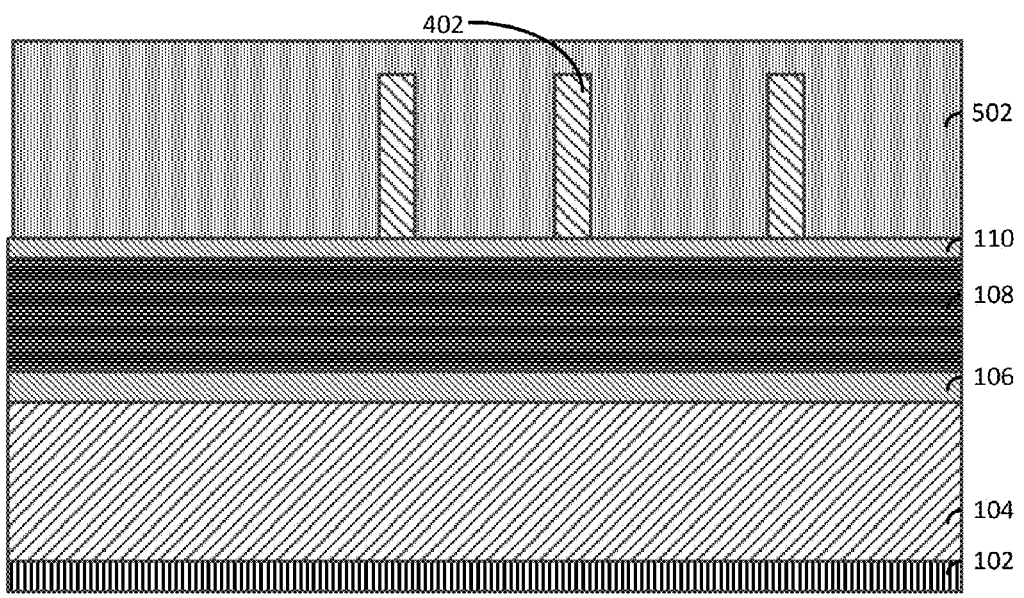

FIG. 5 illustrates a cut-away view following the formation of non-mandrel lines 502 over exposed portions of the second hardmask 110. The non-mandrel lines 502 are formed by, for example, depositing a flowable material such as a carbide material over the second hardmask 110 adjacent to the sacrificial mandrels 402.

Figure 6A:
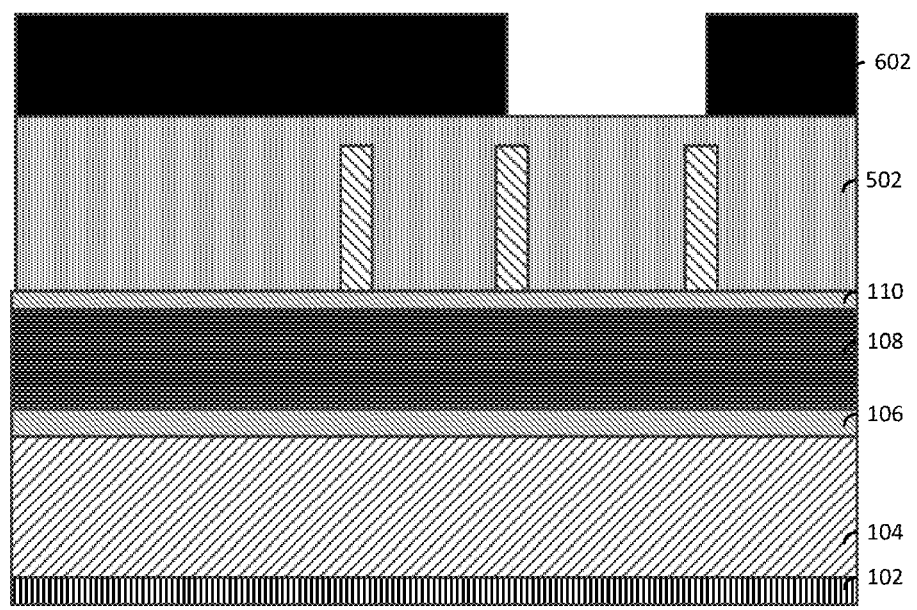
FIG. 6A illustrates a cut-away view along the line A-A (of FIG. 6B) following the patterning of a photolithographic mask over the non-mandrel lines.
Figure 6B:
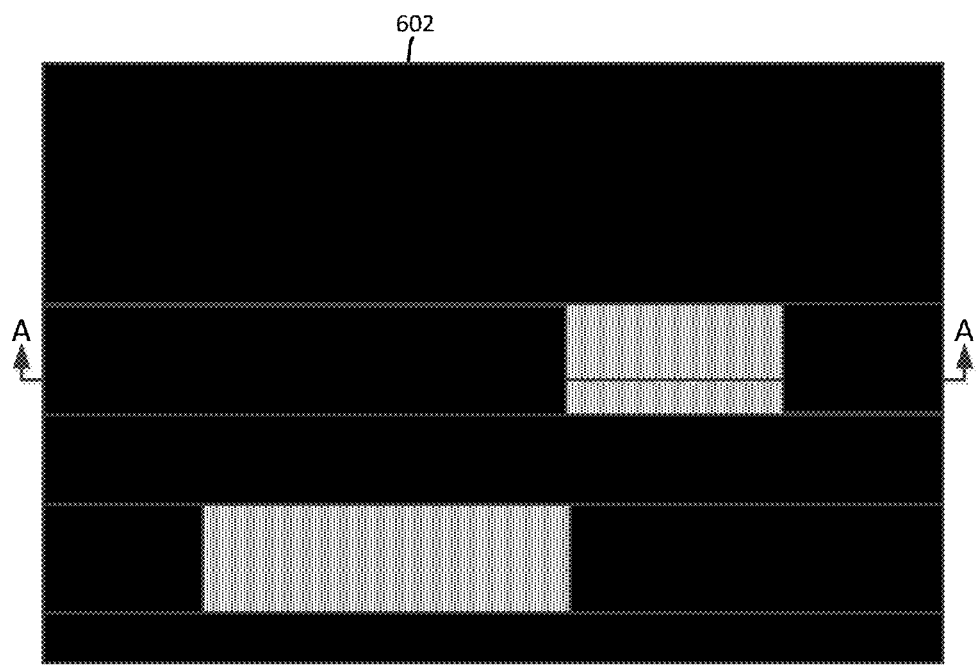
FIG. 6B illustrates a top view of the photolithographic mask.

FIG. 6A illustrates a cut-away view along the line A-A (of FIG. 6B) following the patterning of a photolithographic mask 602 over the non-mandrel lines 502. FIG. 6B illustrates a top view of the photolithographic mask 602.

The mask 602 is arranged to expose a portion of a desired non-mandrel line 502. Because the sacrificial mandrel 402 is formed from a material that is dissimilar from the materials used to form the non-mandrel lines 502, the alignment of the mask 602 need only mask non-mandrel line 502 material that is not intended to be removed in the subsequent etching process (described below). Thus, the mask 602 may be aligned within a margin of error that is substantially equal to the width of the sacrificial mandrel 402 adjacent to the non-mandrel line 502 that will be subsequently etched.

Figure 7:
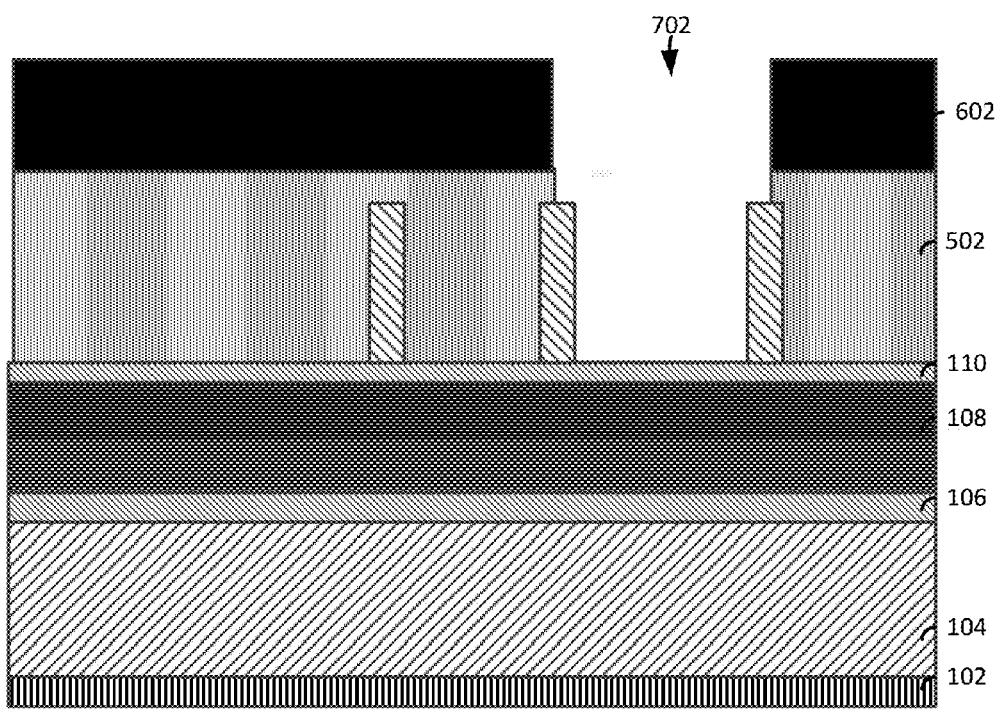

FIG. 7 illustrates a cut-away view following a selective etching process that removes exposed portions of the non-mandrel lines 602. The etching process may include, for example, reactive ion etching. The etching process forms a cavity 702 and exposes portions of the second hardmask 110.

Figure 8:
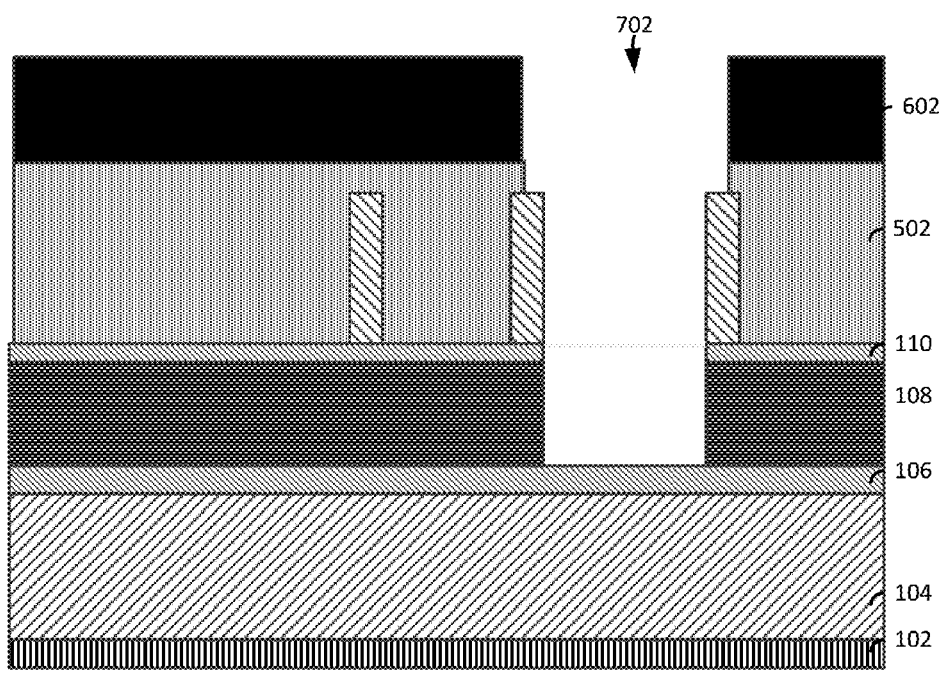

FIG. 8 illustrates a cut-away view following another selective etching process that further increases the depth of the cavity 702 by removing exposed portions of the second hardmask 110 and portions of the organic planarizing layer 108 to expose portions of the first hardmask 106.

Figure 9A:
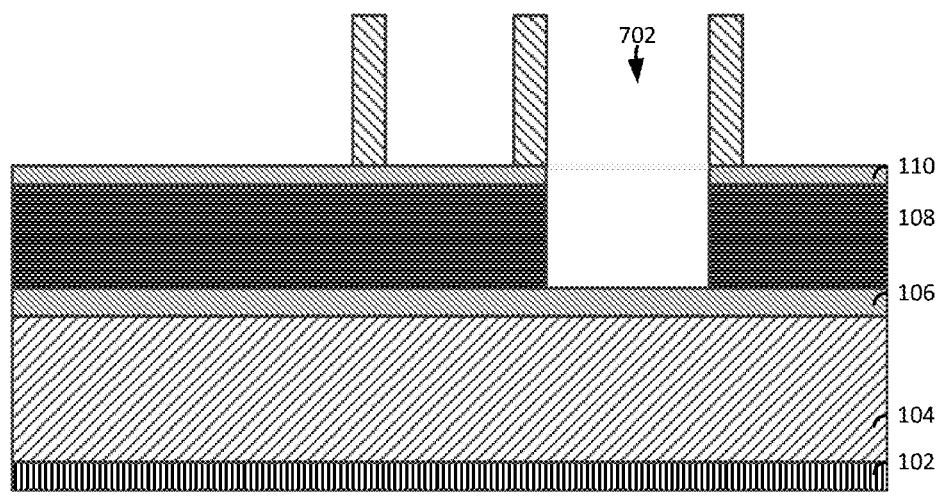
FIG. 9A illustrates a cut-away view along the line A-A (of FIG. 9B) following the removal of the photolithographic mask and the non-mandrel lines.
Figure 9B:
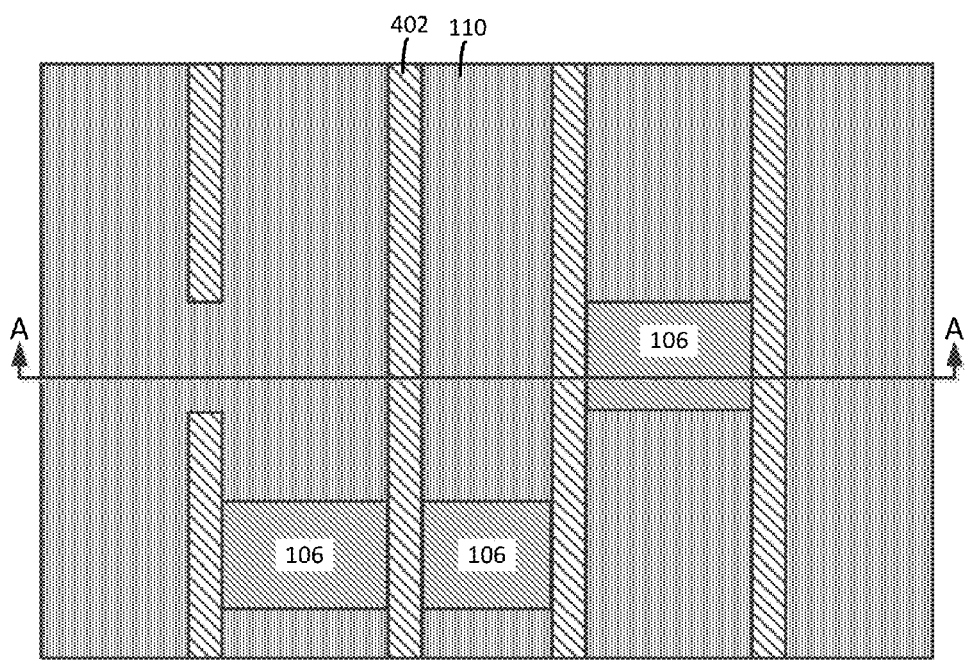
FIG. 9B illustrates a top view of the second hardmask.

FIG. 9A illustrates a cut-away view along the line A-A (of FIG. 9B) following the removal of the photolithographic mask 602 and the non-mandrel lines 502 (of FIG. 8) using a selective etching process. FIG. 9B illustrates a top view of the second hardmask 110.

Figure 10A:
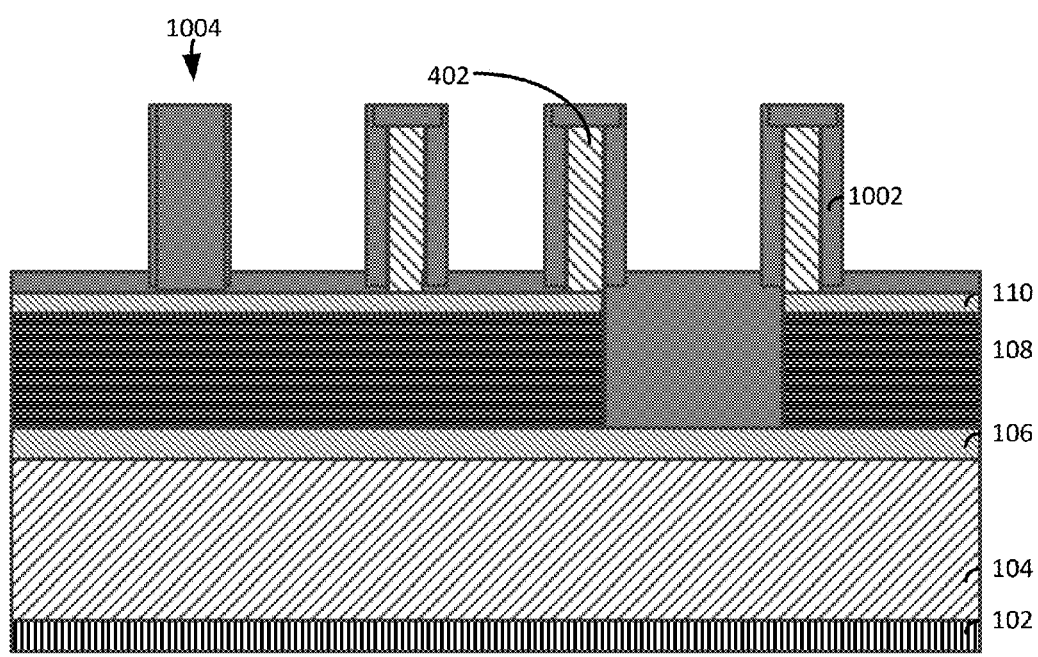
FIG. 10A illustrates a cut-away view along the line A-A (of FIG. 10B) following the deposition of a layer of spacer material.

FIG. 10A illustrates a cut-away view along the line A-A (of FIG. 10B) following the deposition of a layer of spacer material 1002 over exposed portions of the second hardmask 110 and the sacrificial mandrels 402. The layer of spacer material 1002 fills the cavity 702 (of FIG. 9A).

Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Figure 10B:
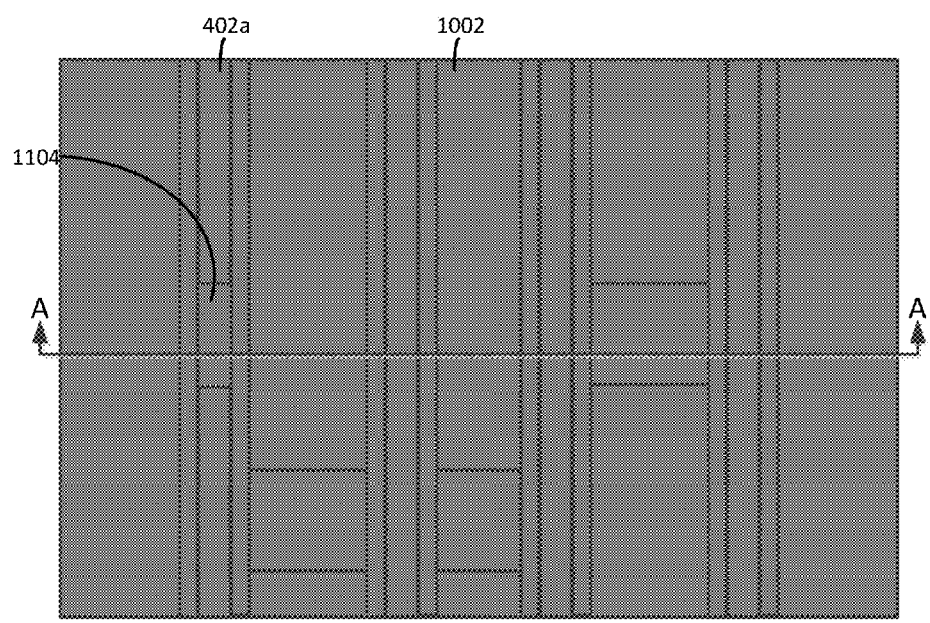
FIG. 10B illustrates a top view following the deposition of the layer of spacer material.

The deposition of the layer of spacer material 1002 results in a spacer "pinch off" region 1004 that is formed by a gap patterned in the sacrificial mandrel 402a (of FIG. 10B). FIG. 10B illustrates a top view following the deposition of the layer of spacer material 1002.

Figure 11:
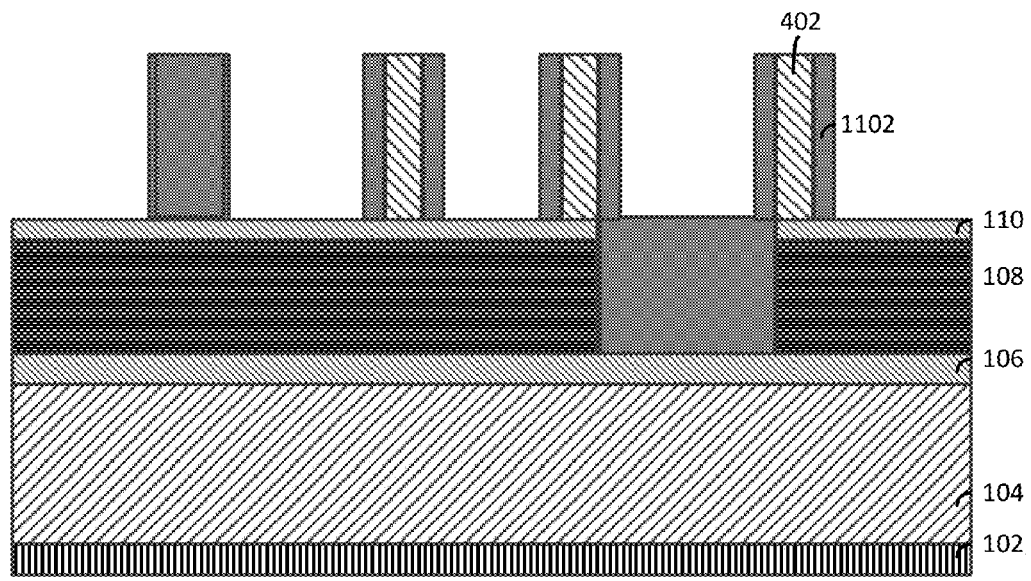

FIG. 11 illustrates a cut-away view following the formation of spacers 1102 along sidewalls of the sacrificial mandrels 402. Following the deposition of the layer of spacer material, a suitable anisotropic etching process such as, for example, a reactive ion etching process is performed to remove portions of the layer of spacer material and form the spacers 1102.

Figure 12A:
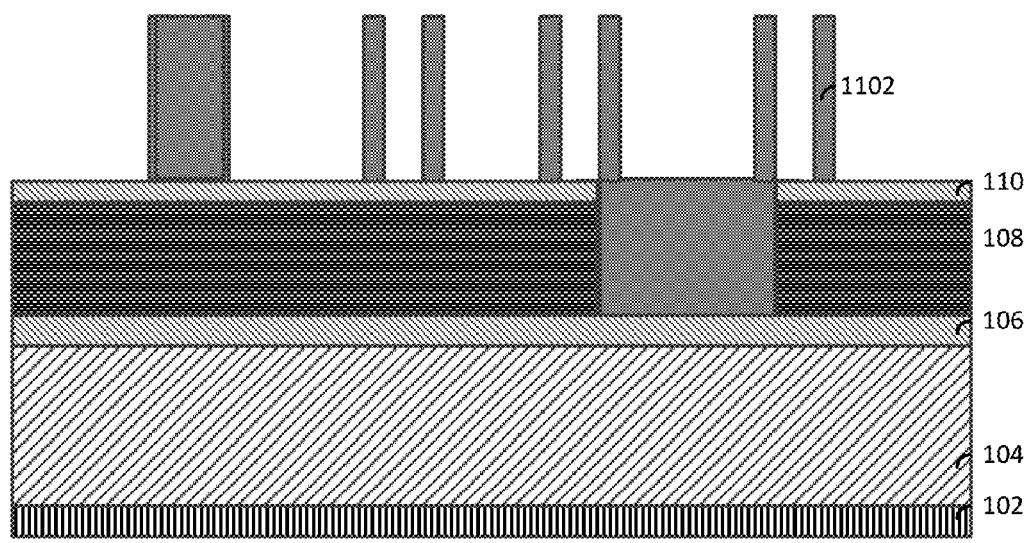
FIG. 12A illustrates a cut-away view along the line A-A (of FIG. 12B) following the removal of the sacrificial mandrels.
Figure 12B:
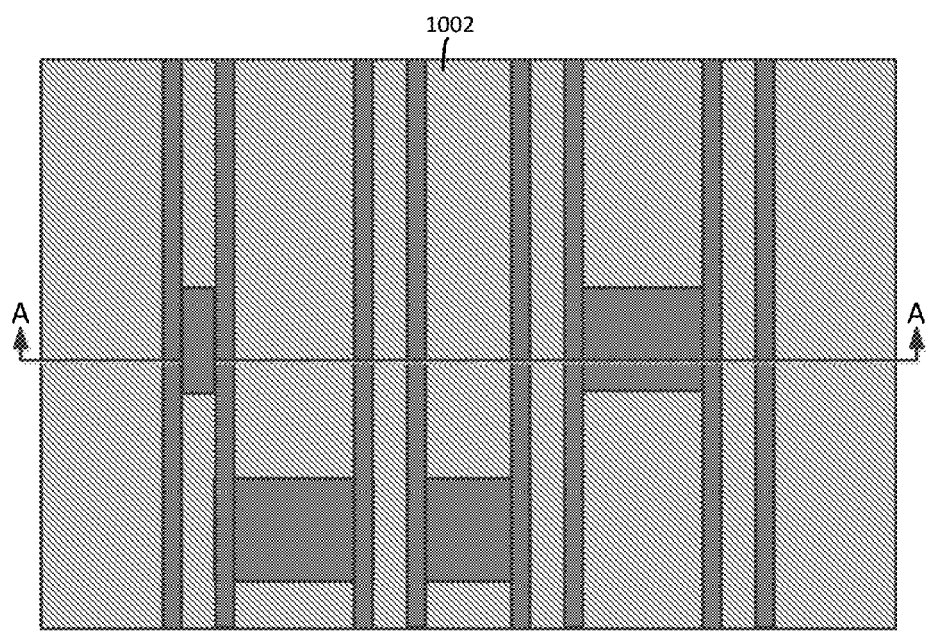
FIG. 12B illustrates a top view following the removal of the sacrificial mandrels.

FIG. 12A illustrates a cut-away view along the line A-A (of FIG. 12B) following the removal of the sacrificial mandrels 402 (of FIG. 11) using a suitable selective etching process such as, for example, reactive ion etching. FIG. 12B illustrates a top view following the removal of the sacrificial mandrels 402.

Figure 13:
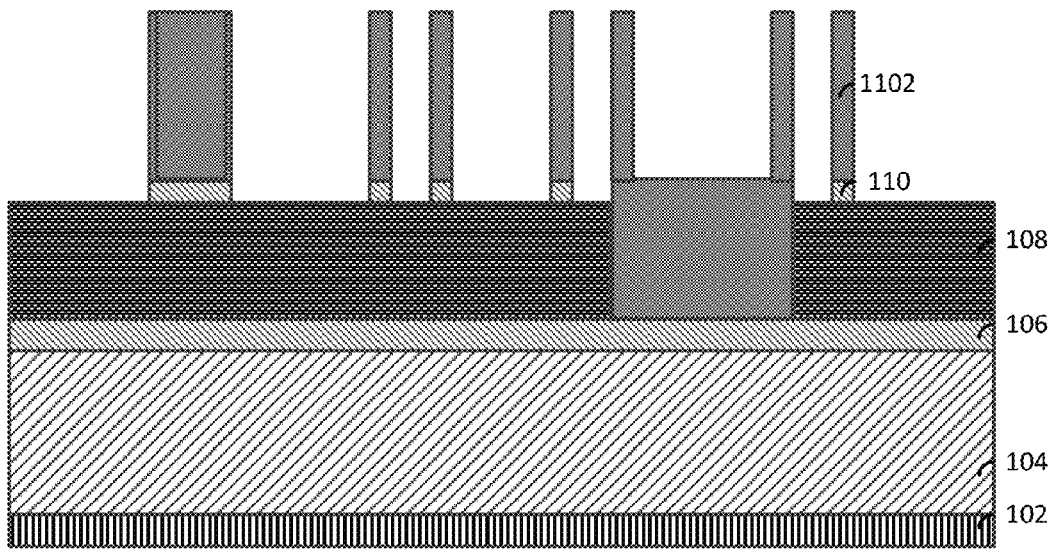

FIG. 13 illustrates a cut-away view following a selective etching process that removes exposed portions of the underlying second hardmask 110 to expose a portion of the organic planarization layer 108 using an anisotropic etching process.

Figure 14:
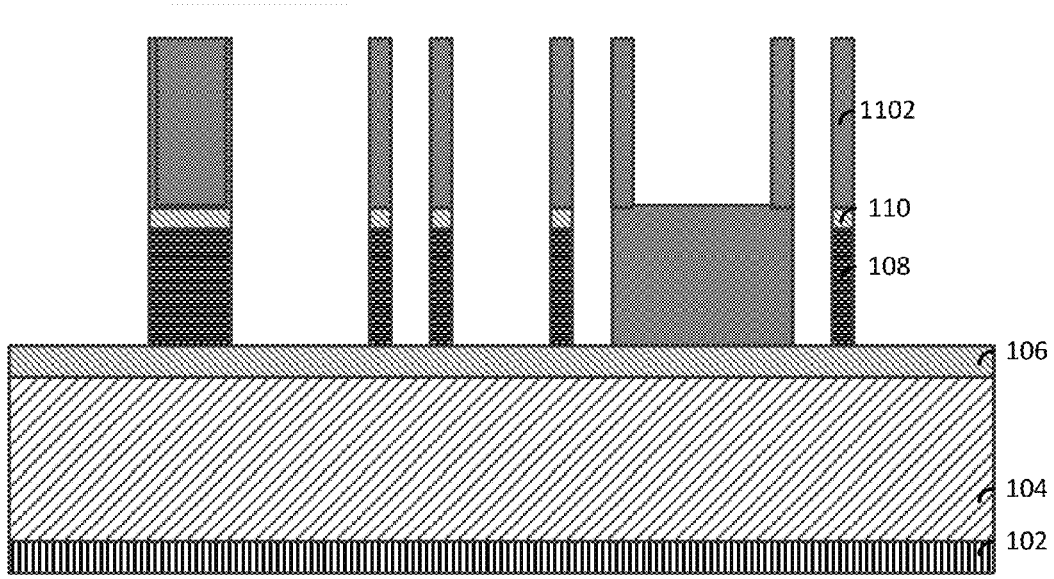

FIG. 14 illustrates a cut-away view following a selective anisotropic etching process that removes exposed portions of the organic planarization layer 108 to expose portions of the first hardmask 106.

Figure 15:
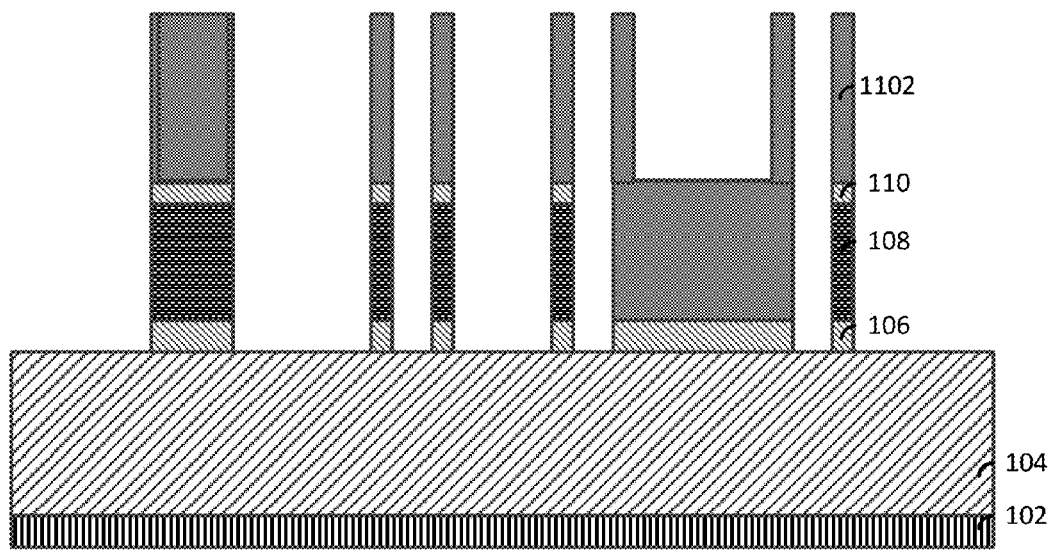

FIG. 15 illustrates a cut-away view following another selective anisotropic etching process that removes exposed portions of the first hardmask 106 to expose portions of the inter-level dielectric layer 104.

Figure 16A:
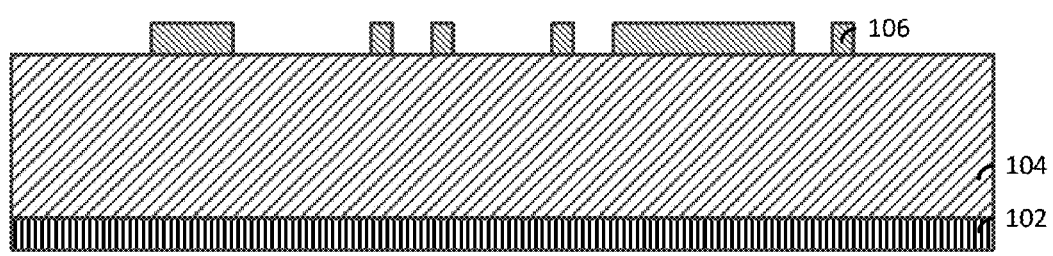
FIG. 16A illustrates a cut-away view along the line A-A (of FIG. 15B) of the resultant structure following the removal of the organic planarization layer, the second hardmask, and the spacers.

FIG. 16A illustrates a cut-away view along the line A-A (of FIG. 15B) of the resultant structure following the removal of the organic planarization layer 108, the second hardmask 110, and the spacers 1102 (of FIG. 15).

Figure 16B:
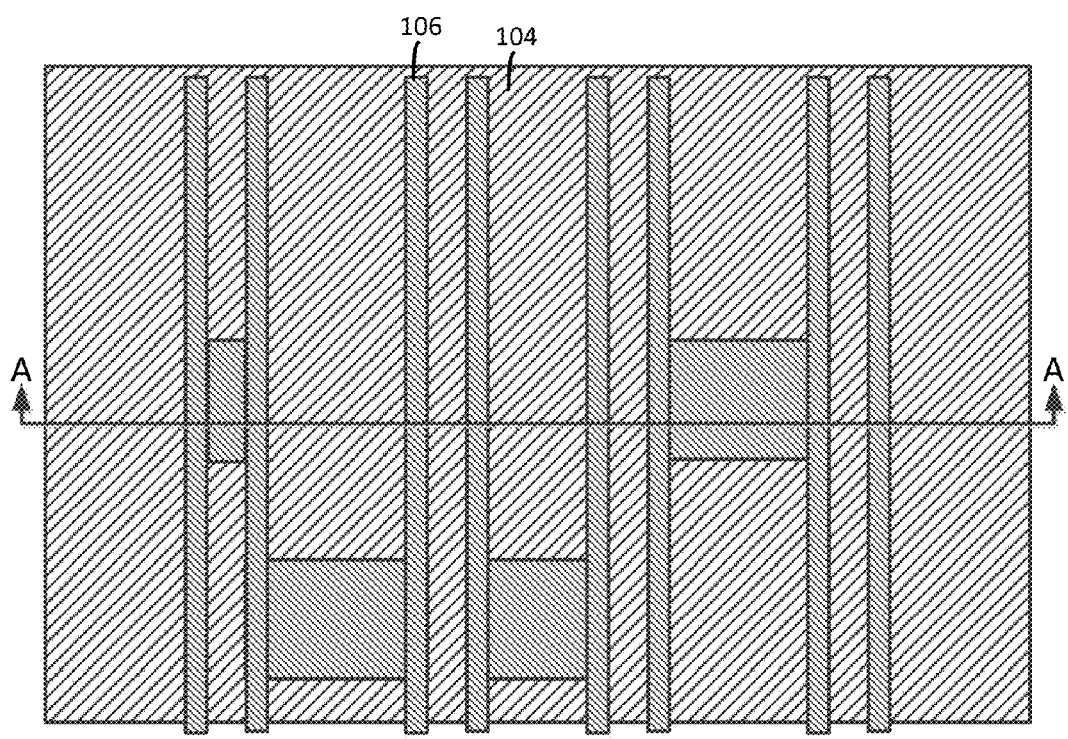
FIG. 16B illustrates a top view following the removal of the organic planarization layer, the second hardmask, and the spacers.

FIG. 16B illustrates a top view following the removal of the organic planarization layer 108, the second hardmask 110, and the spacers 1102.

Figure 17:
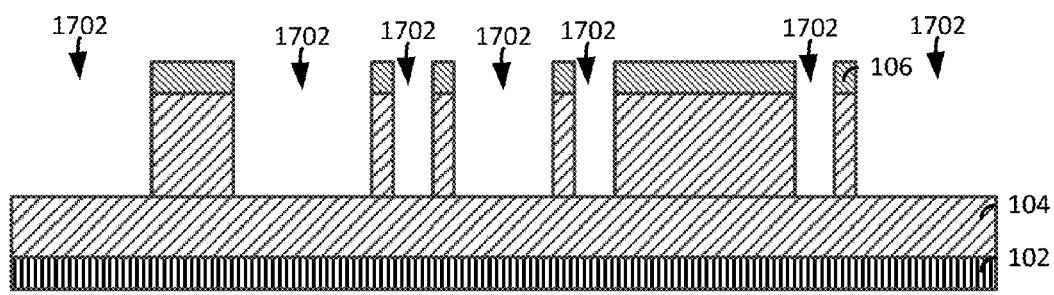

FIG. 17 illustrates a cut-away view following a selective etching process such as, for example, reactive ion etching. The etching process forms cavities (trenches) 1702 by removing exposed portions of the inter-level dielectric layer 104.

Figure 18:
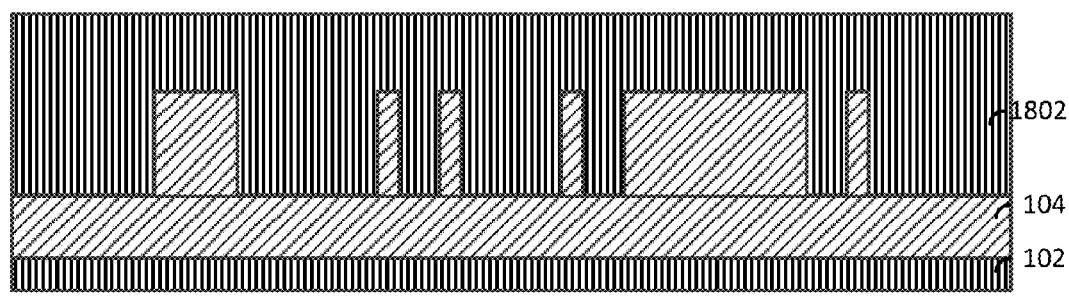

FIG. 18 illustrates a cut-away view following the deposition of a conductive material 1802 such as, for example, copper, silver, gold, aluminum, or another conductive material into the trenches 1702 (of FIG. 17).

Figure 19A:
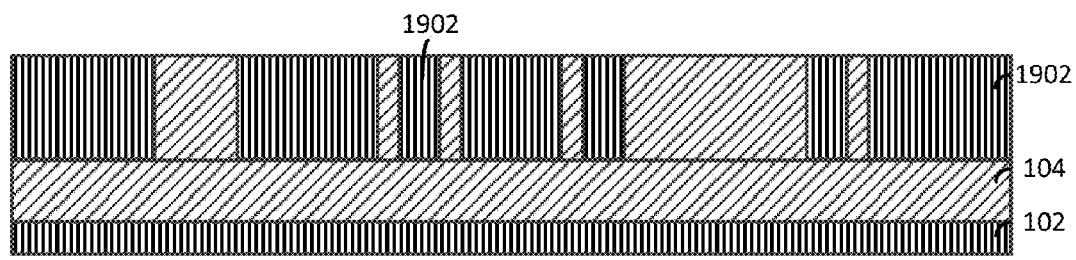
FIG. 19A illustrates a cut-away view along the line A-A (of FIG. 19B) following a planarization process.
Figure 19B:
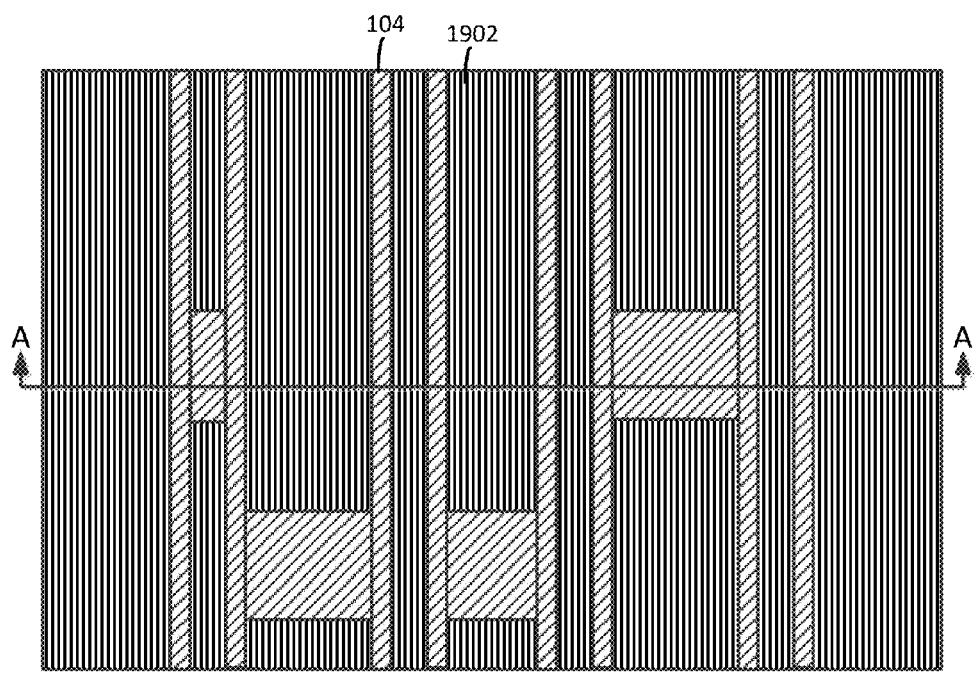

FIG. 19A illustrates a cut-away view along the line A-A (of FIG. 19B) following a planarization process. The planarization process such as, for example, chemical mechanical polishing may be performed to remove overburden material and form conductive lines 1902. Prior to depositing the conductive material, a liner layer (not shown) may be formed. FIG. 19B illustrates a top view of the resultant structure following the formation of the conductive lines 1902.

FIGS. 20A-36B illustrate another exemplary embodiment of a method for forming conductive lines for a semiconductor device.

Figure 20A:
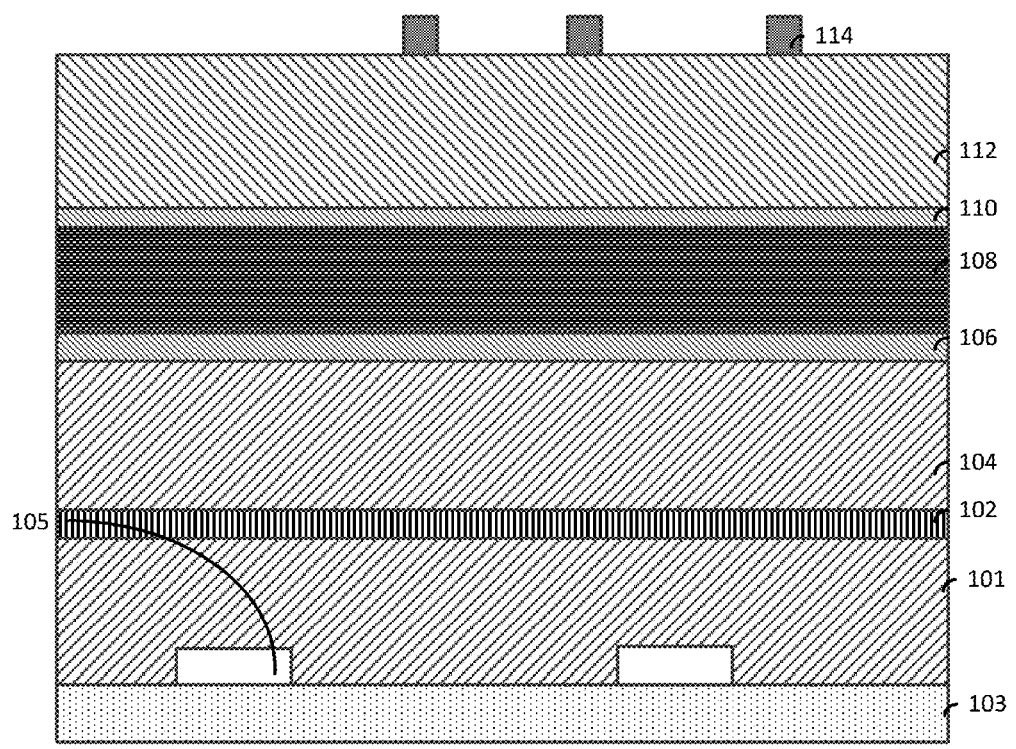

FIG. 20A illustrates a side view of a structure formed on a substrate 103 that is similar to the structure described above in FIG. 1. Semiconductor devices 105 are arranged on the substrate 103, a layer of insulating material 101 is arranged on the semiconductor devices 105 and the substrate 103. A conductive line 102 is arranged on the layer of insulating material 101. An inter-level dielectric layer (insulator layer) 104 is arranged on the conductive line 102. A first hardmask 106 is arranged on the inter-level dielectric layer 104. An organic planarization layer 108 is arranged on the first hardmask 106 and a second hardmask 110 is arranged on the organic planarization layer 108.

A sacrificial mandrel layer 112 is arranged on the second hardmask 110. The sacrificial mandrel layer 112 in the illustrated exemplary embodiment includes an amorphous silicon material, alternate exemplary embodiments may include other materials such as, for example, an amorphous carbon material or a nitride material such as silicon nitride or titanium nitride.

Figure 20B:
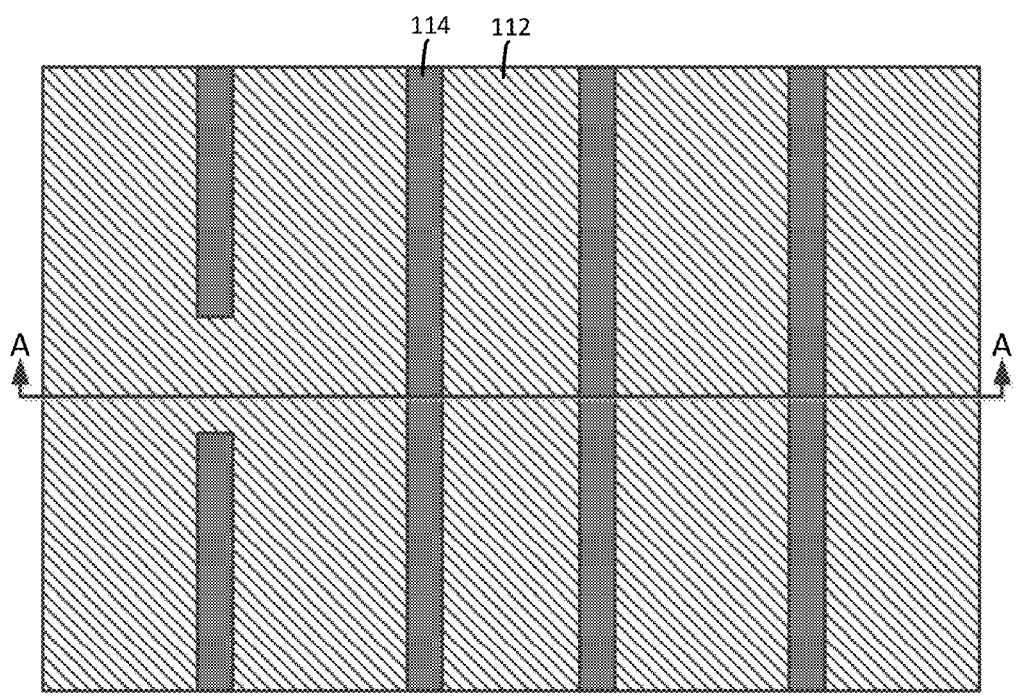
FIG. 20B illustrates a top view of the resist arranged on the sacrificial mandrel layer.

A resist 114 is patterned on the sacrificial mandrel layer 112. Suitable resist masks include photoresists, electron-beam resists, ion-beam resists, X-ray resists and etch resists. The resist may a polymeric spin on material or a polymeric material. FIG. 20B illustrates a top view of the resist 114 arranged on the sacrificial mandrel layer 112.

Figure 21A:
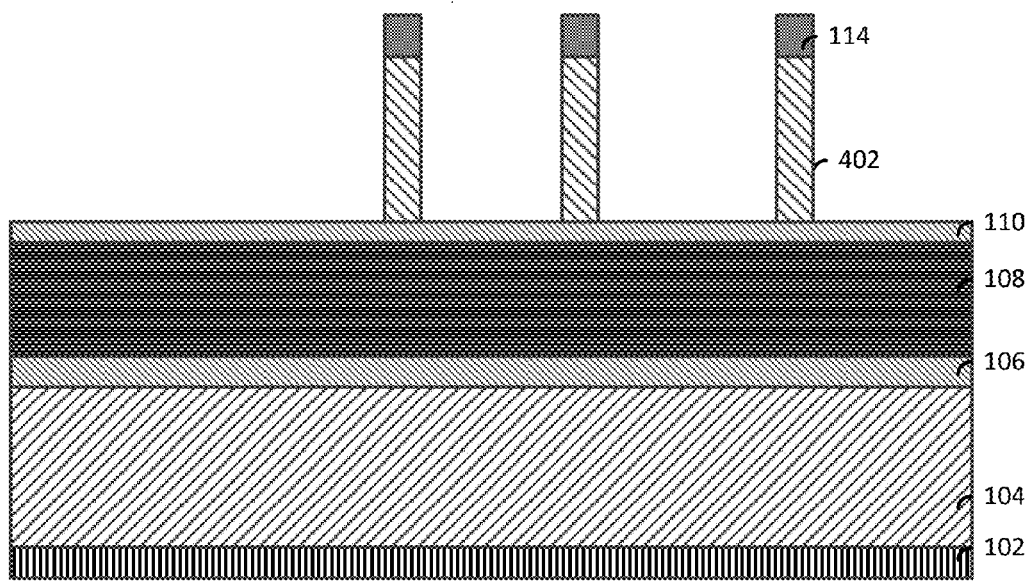
FIG. 21A illustrates a cut-away view along the line A-A (of FIG. 21B) following the formation of sacrificial mandrels.
Figure 21B:
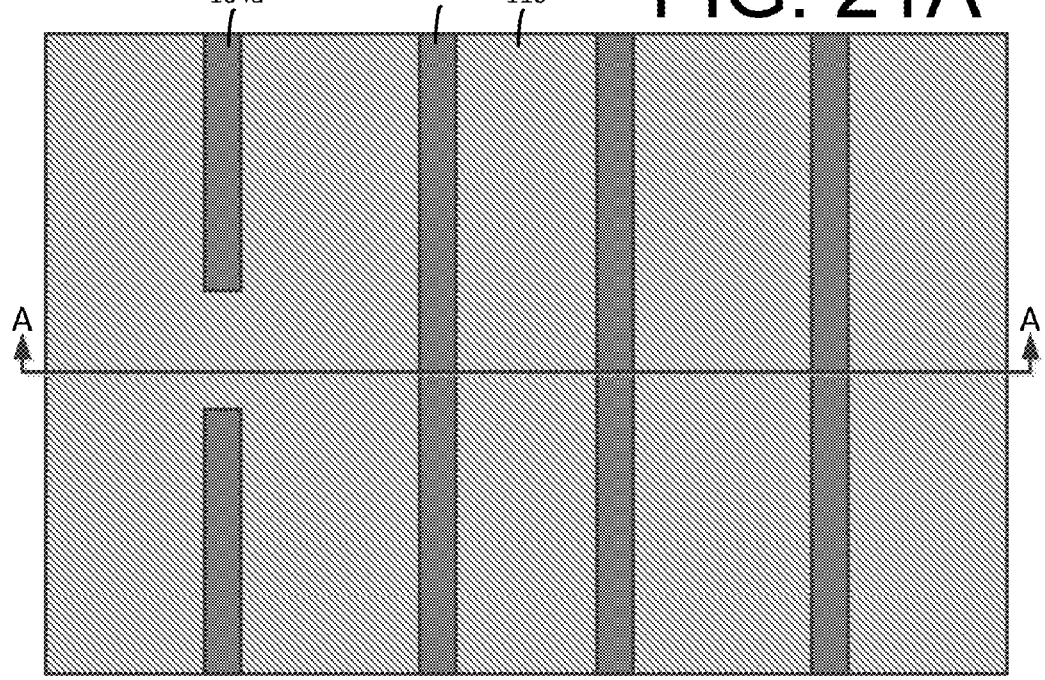
FIG. 21B illustrates a top view following the formation of the sacrificial mandrels.

FIG. 21A illustrates a cut-away view along the line A-A (of FIG. 21B) following the formation of sacrificial mandrels 402. The sacrificial mandrels 402 are formed by performing an etching process such as, for example, reactive ion etching that selectively removes exposed portions of the sacrificial mandrel layer 112 to expose portions of the second hardmask 110 and form sacrificial mandrels (mandrel lines) 402. For simplicity and illustrative purposes, the substrate 103, the semiconductor devices 105, and the insulator layer 101 have been omitted from FIG. 2 and subsequent figures. FIG. 21B illustrates a top view following the formation of the sacrificial mandrels 402.

Figure 22:
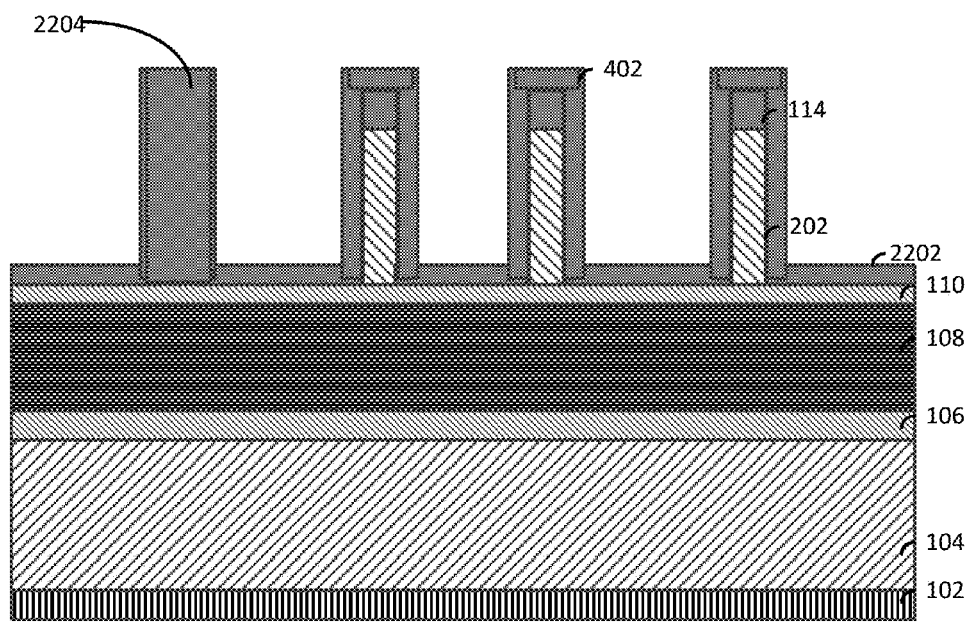

FIG. 22 illustrates a cut-away view following the deposition of a layer of spacer material 2202 over exposed portions of the second hardmask 110 and the sacrificial mandrels 402.

Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

The deposition of the layer of spacer material 2202 results in a spacer "pinch off" region 2204 that is formed by a gap patterned in the sacrificial mandrel 402a (of FIG. 21B).

Figure 23:
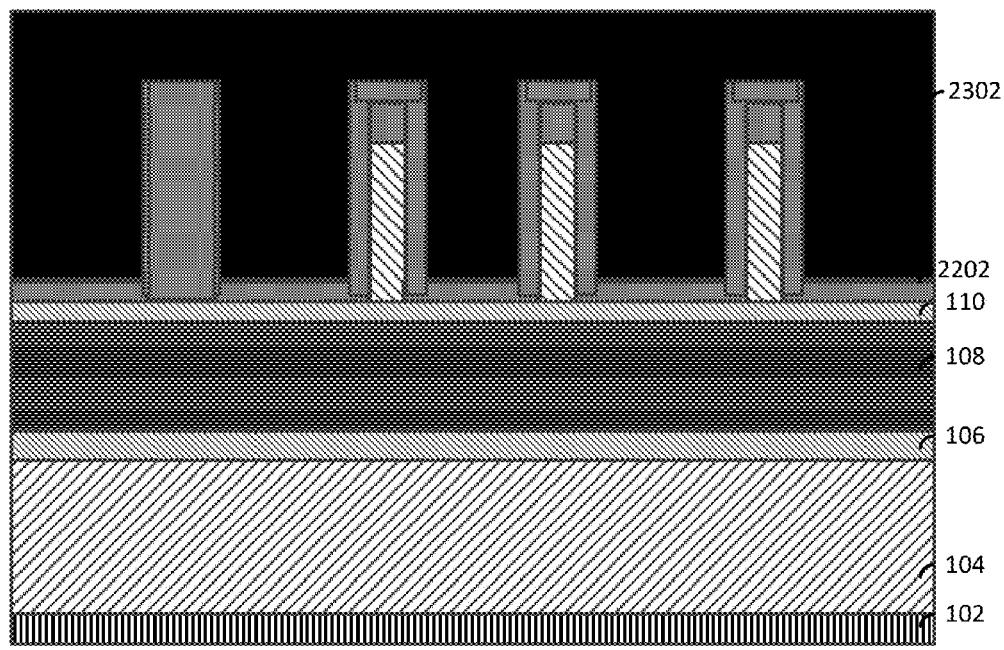

FIG. 23 illustrates a cut-away view following the deposition of a mask 2302 over exposed portions of the layer of spacer material 2202.

Figure 24A:
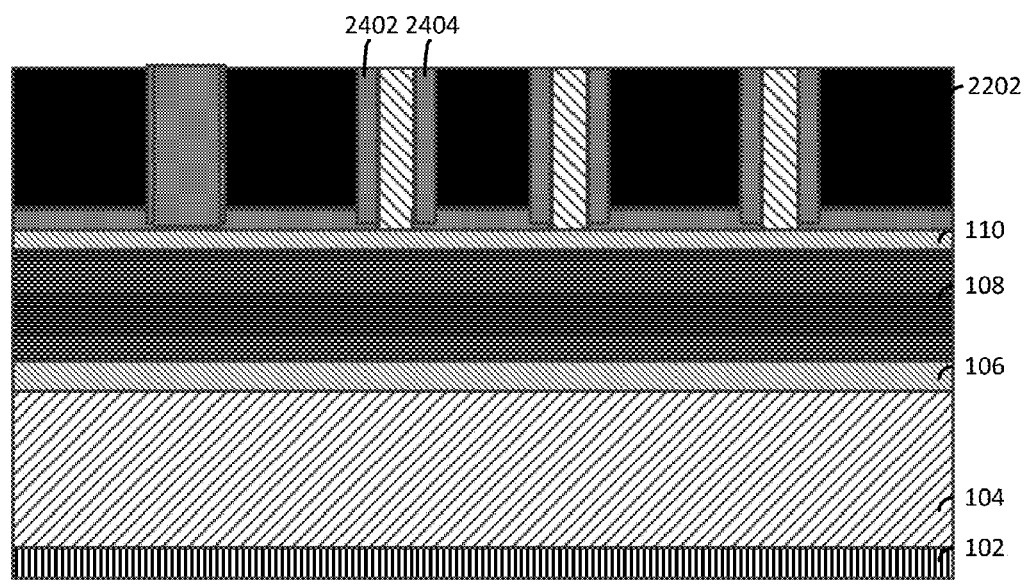
FIG. 24A illustrates a cut-away view along the line A-A (of FIG. 24B) following the formation of spacers along sidewalls of the sacrificial mandrels.
Figure 24B:
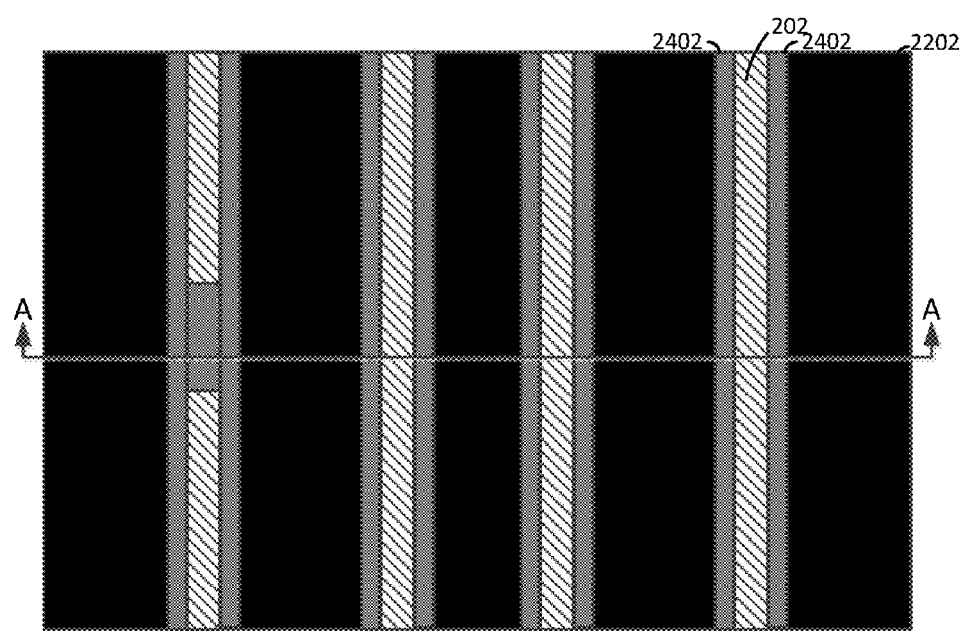
FIG. 24B illustrates a top view of the spacers.

FIG. 24A illustrates a cut-away view along the line A-A (of FIG. 24B) following the formation of spacers 2402 along sidewalls of the sacrificial mandrels 402. A suitable anisotropic etching process such as, for example, a reactive ion etching process is performed to remove portions of the layer of spacer material and form the spacers 2402. FIG. 24B illustrates a top view of the spacers 2402.

Figure 25:
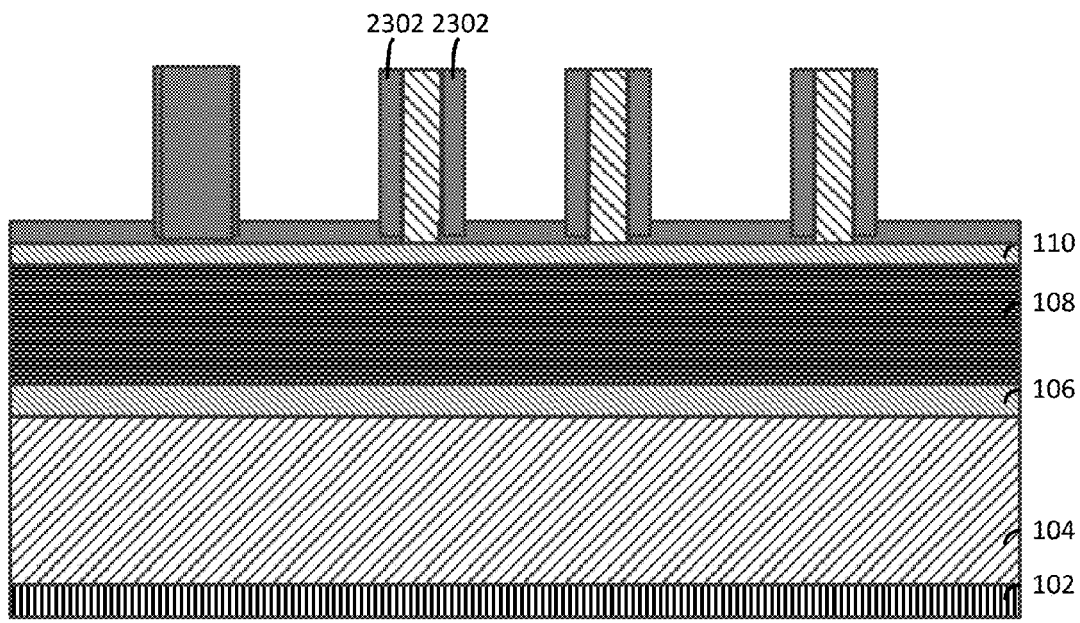

FIG. 25 illustrates a cut-away view following the removal of the mask 2302 (of FIG. 24A) to expose portions of the spacers 2402.

Figure 26A:
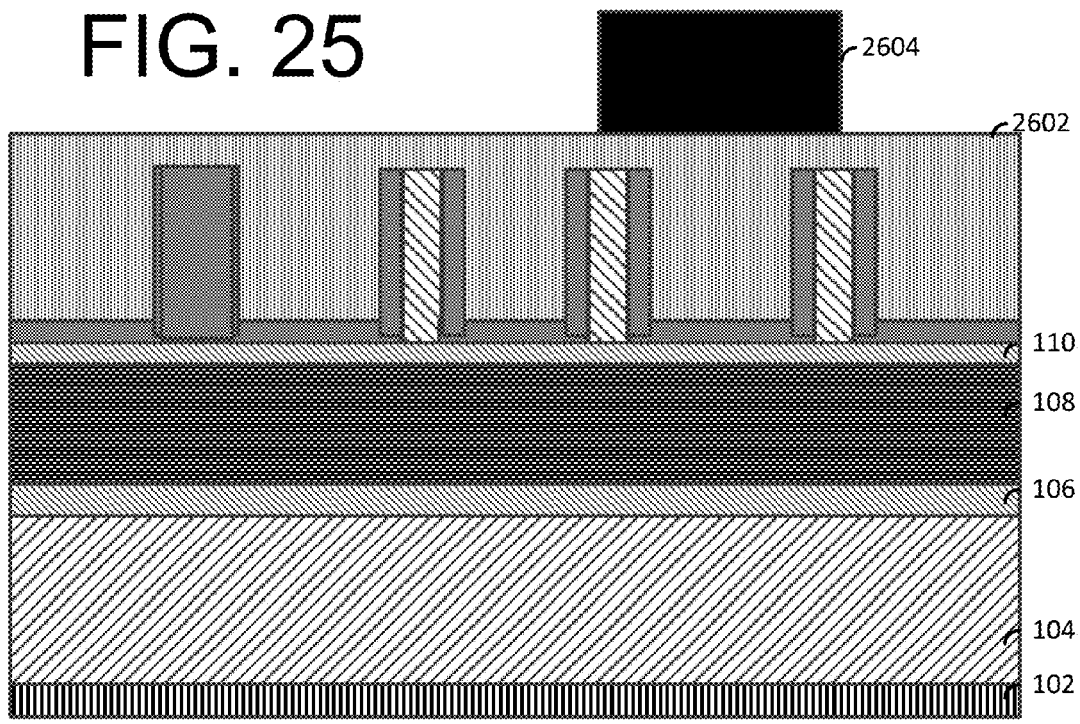
FIG. 26A illustrates a cut-away view along the line A-A (of FIG. 26B) following the formation of non-mandrel lines.

FIG. 26A illustrates a cut-away view along the line A-A (of FIG. 26B) following the formation of non-mandrel lines 2602 and the patterning of a photolithographic mask 2604 over portions of the non-mandrel lines 2602. The non-mandrel lines 2602 are formed by, for example, depositing a flowable material such as a carbide material.

Figure 26B:
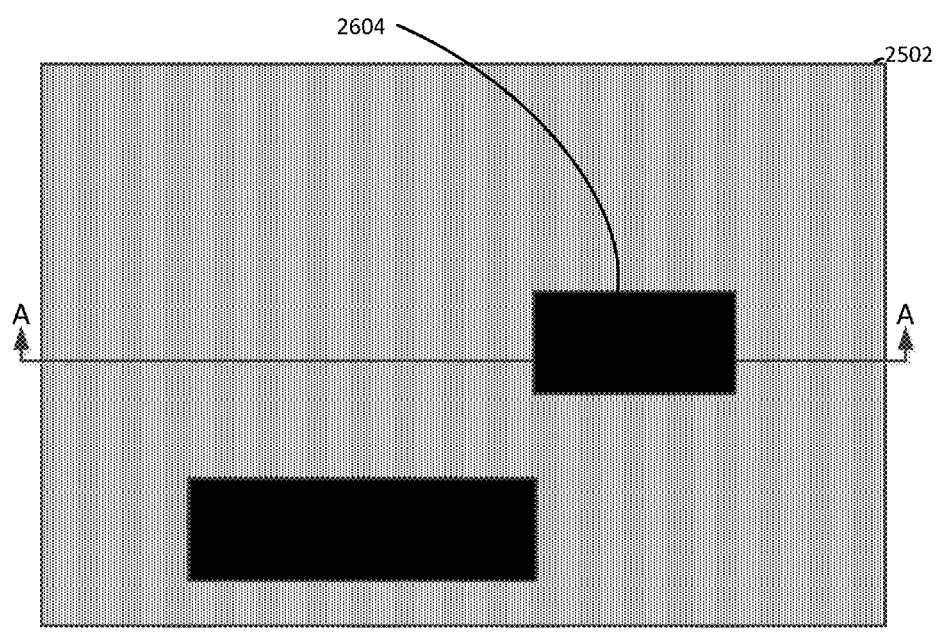
FIG. 26B illustrates a top view of the mask.

The mask 2604 is arranged to expose a portion of a desired non-mandrel line 2602. Because the sacrificial mandrel 402 is formed from a material that is dissimilar from the materials used to form the non-mandrel lines 2602, the alignment of the mask 2604 need only mask non-mandrel line 2602 material that is not intended to be removed in the subsequent etching process (described below). Thus, the mask 2604 may be aligned within a margin of error that is substantially equal to the width of the sacrificial mandrel 402 adjacent to the non-mandrel line 2602 that will be subsequently etched. FIG. 26B illustrates a top view of the mask 2604.

Figure 27:
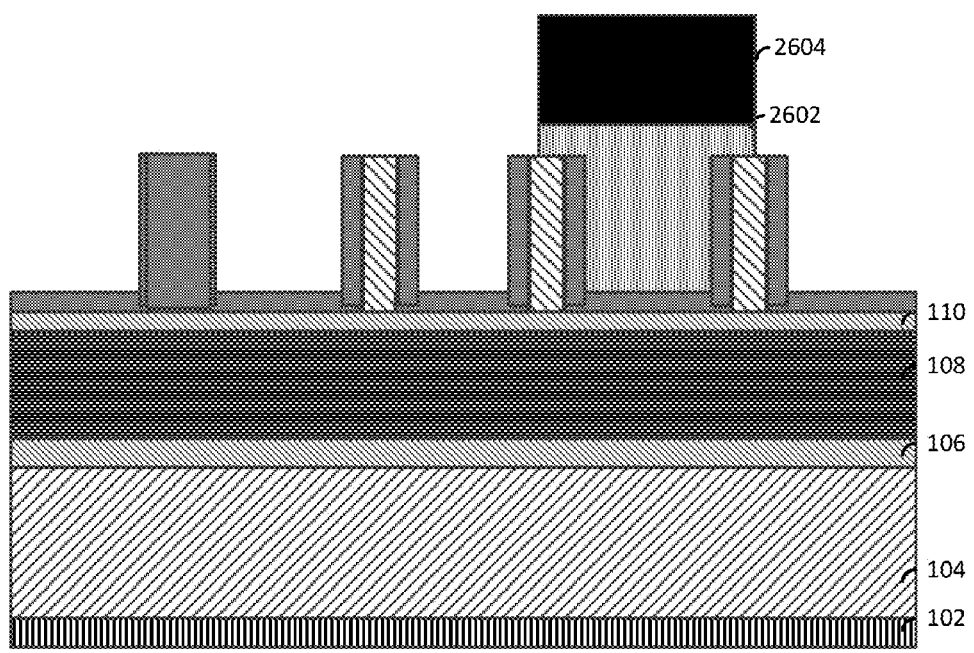

FIG. 27 illustrates a cut-away view following a selective anisotropic etching process that removes exposed portions of the non-mandrel line 2602.

Figure 28A:
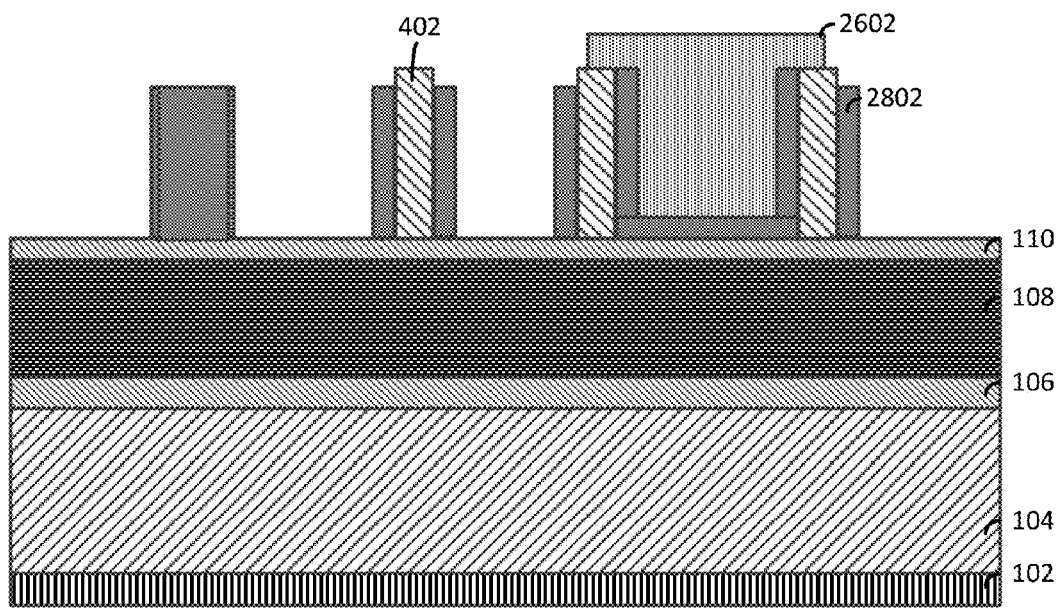
FIG. 28A illustrates a cut-away view following the formation of spacers along sidewalls of the sacrificial mandrels.
Figure 28B:
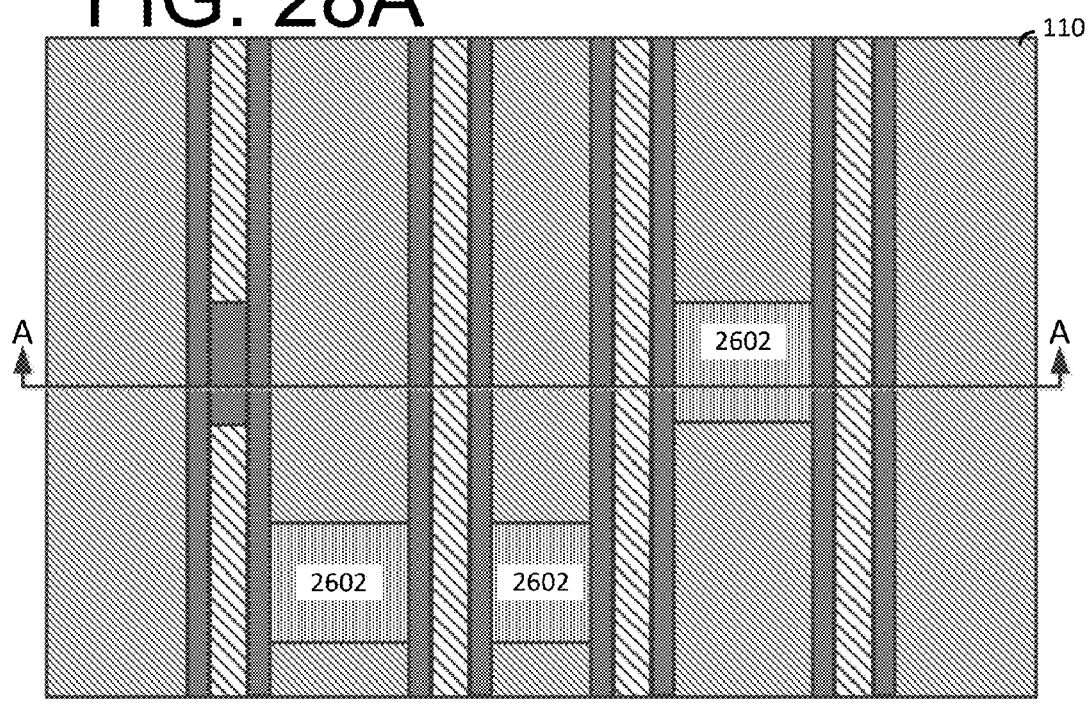
FIG. 28B illustrates a top view of the spacers.

FIG. 28A illustrates a cut-away view following the formation of spacers 2802 along sidewalls of the sacrificial mandrels 402. Following the deposition of the layer of spacer material, a suitable anisotropic etching process such as, for example, a reactive ion etching process is performed to remove portions of the layer of spacer material and form the spacers 2802. FIG. 28B illustrates a top view of the spacers 2802.

Figure 29A:
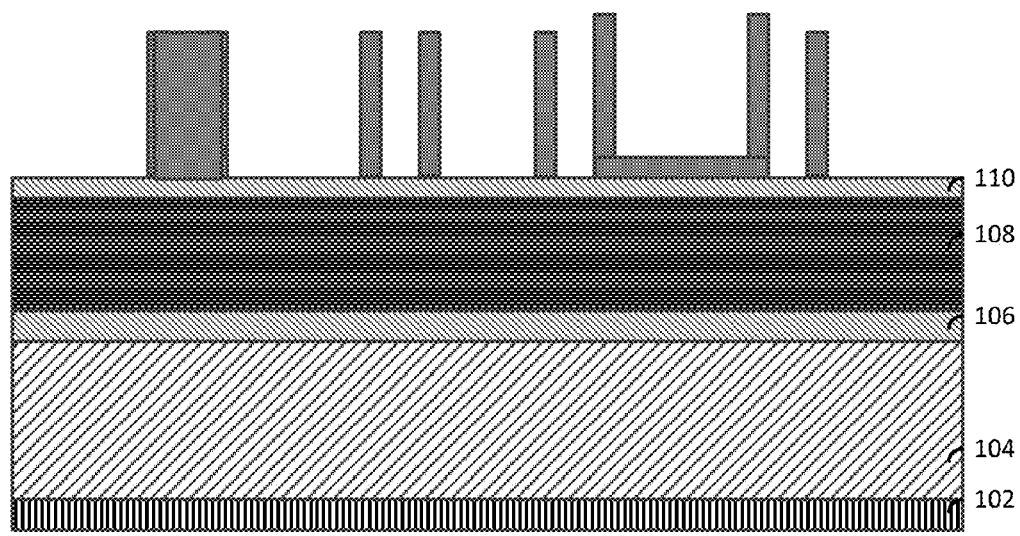
FIG. 29A illustrates a cut-away view along the line A-A (of FIG. 29B) following the removal of the sacrificial mandrels.
Figure 29B:
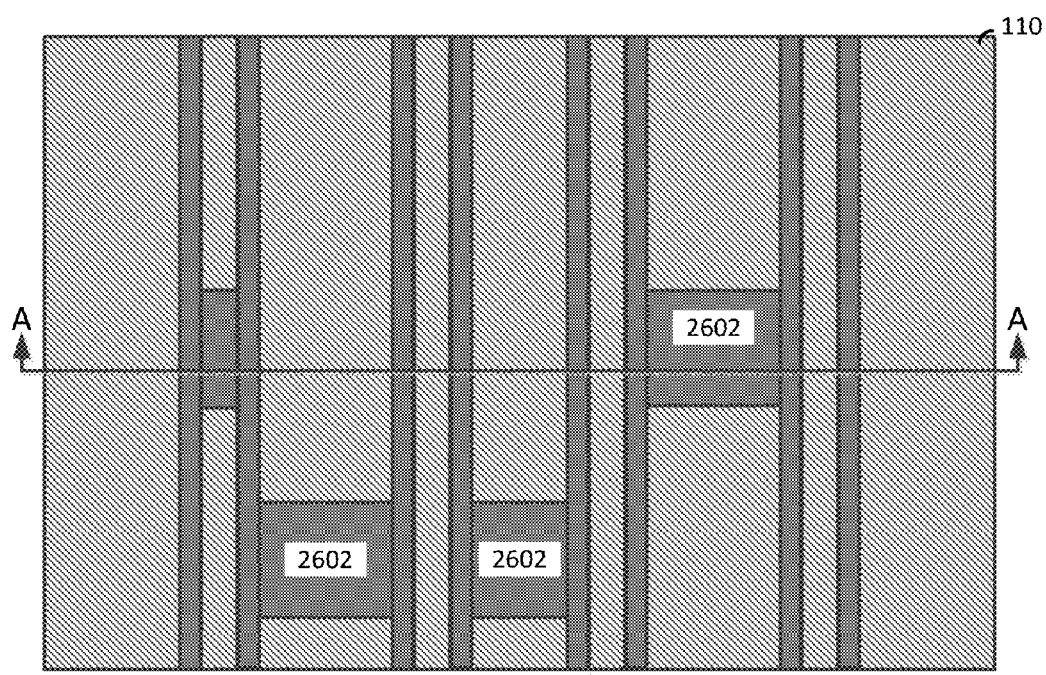
FIG. 29B illustrates a top view following the removal of the sacrificial mandrels.

FIG. 29A illustrates a cut-away view along the line A-A (of FIG. 29B) following the removal of the sacrificial mandrels 402 (of FIG. 28A) using a suitable selective etching process such as, for example, reactive ion etching. FIG. 29B illustrates a top view following the removal of the sacrificial mandrels 402.

Figure 30:
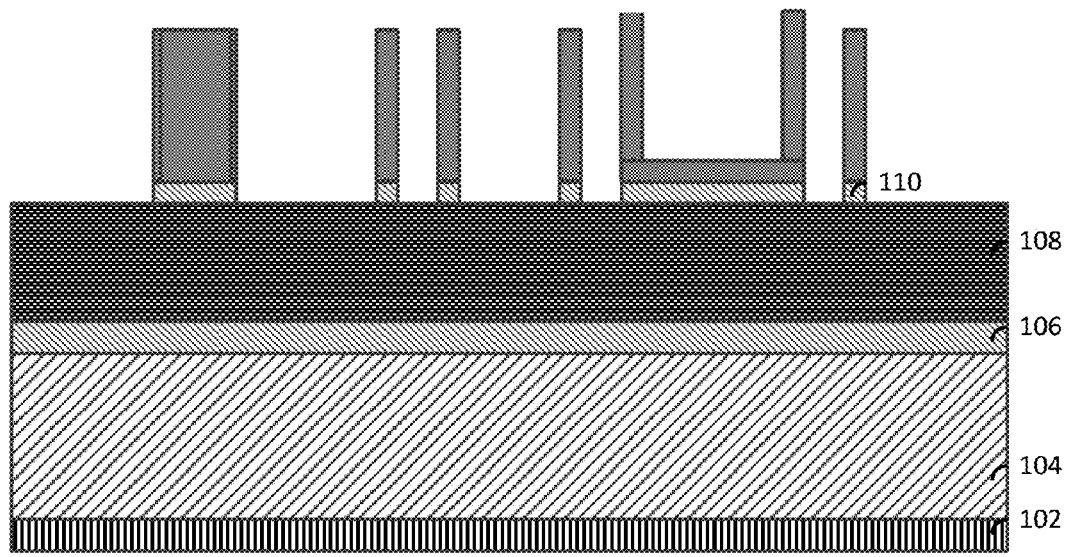

FIG. 30 illustrates a cut-away view following a selective etching process that removes exposed portions of the underlying second hardmask 110 to expose a portion of the organic planarization layer 108 using an anisotropic etching process.

Figure 31:
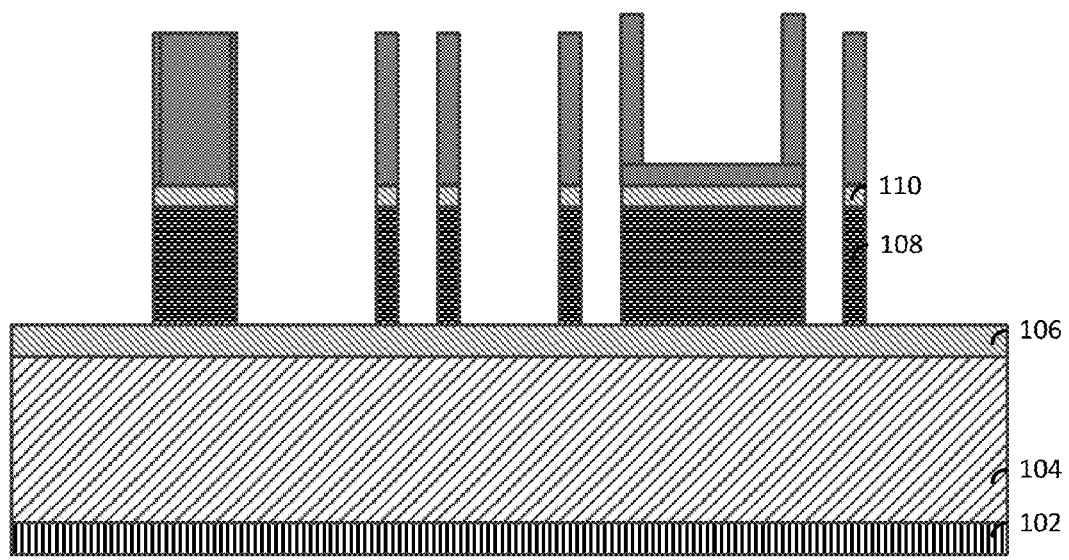

FIG. 31 illustrates a cut-away view following a selective anisotropic etching process that removes exposed portions of the organic planarization layer 108 to expose portions of the first hardmask 106.

Figure 32:
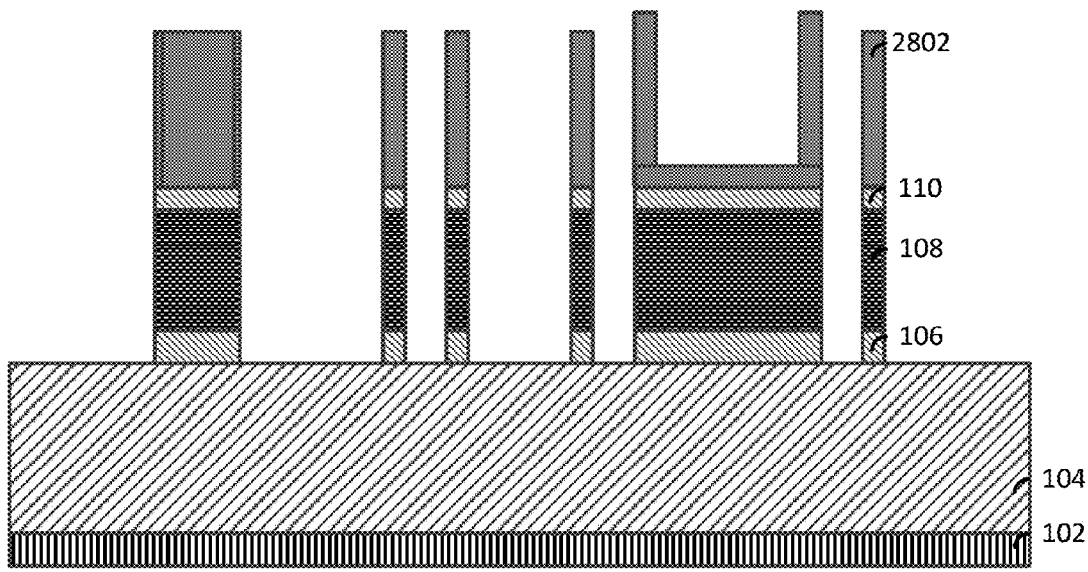

FIG. 32 illustrates a cut-away view following another selective anisotropic etching process that removes exposed portions of the first hardmask 106 to expose portions of the inter-level dielectric layer 104.

Figure 33A:
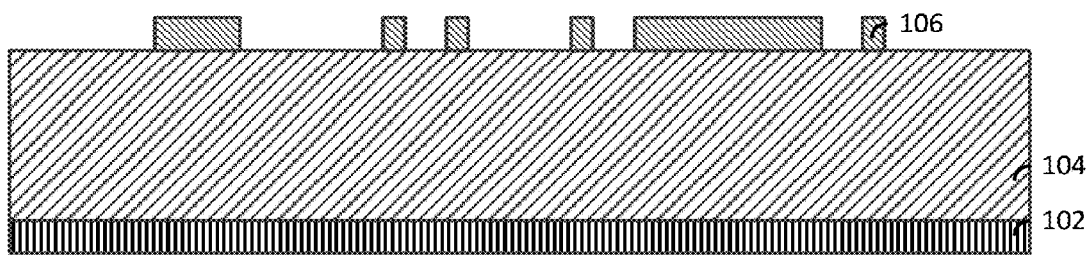
FIG. 33A illustrates a cut-away view along the line A-A (of FIG. 33B) of the resultant structure following the removal of the organic planarization layer, the second hardmask, and the spacers.

FIG. 33A illustrates a cut-away view along the line A-A (of FIG. 33B) of the resultant structure following the removal of the organic planarization layer 108, the second hardmask 110, and the spacers 2802 (of FIG. 32).

Figure 33B:
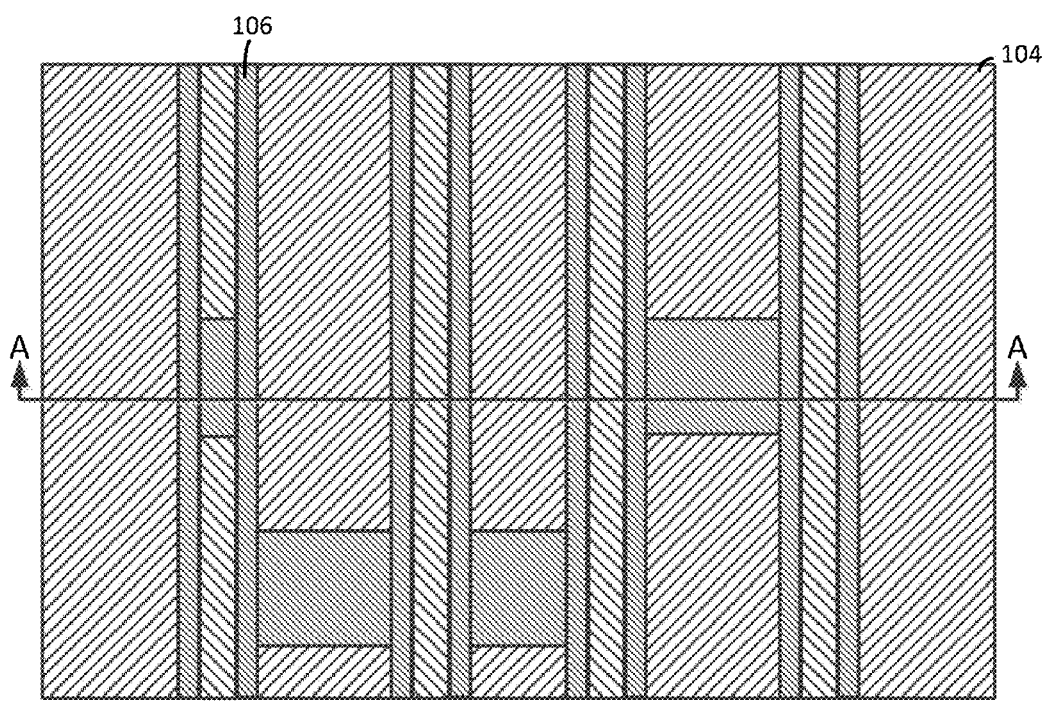
FIG. 33B illustrates a top view following the removal of the organic planarization layer, the second hardmask, and the spacers.

FIG. 33B illustrates a top view following the removal of the organic planarization layer 108, the second hardmask 110, and the spacers 2802.

Figure 34:
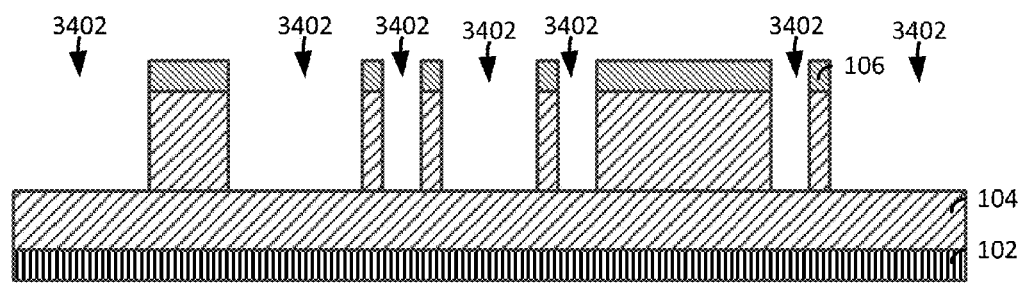

FIG. 34 illustrates a cut-away view following a selective etching process such as, for example, reactive ion etching. The etching process forms cavities (trenches) 3402 by removing exposed portions of the inter-level dielectric layer 104.

Figure 35:
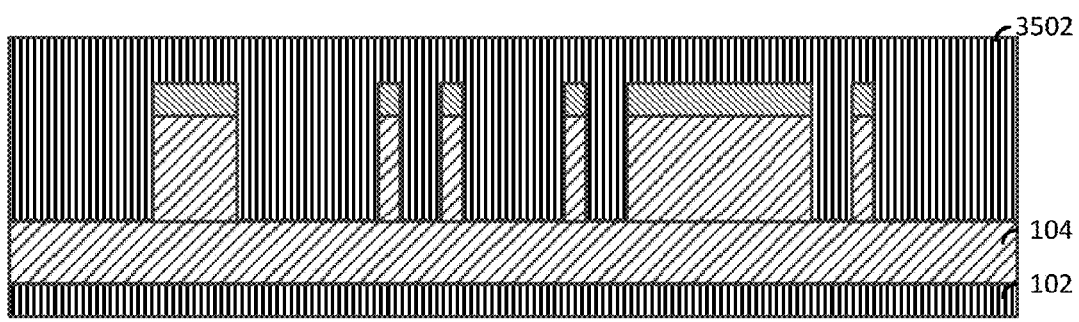

FIG. 35 illustrates a cut-away view following the deposition of a conductive material 3502 such as, for example, copper, silver, gold, aluminum, or another conductive material into the trenches 3402 (of FIG. 34).

Figure 36A:
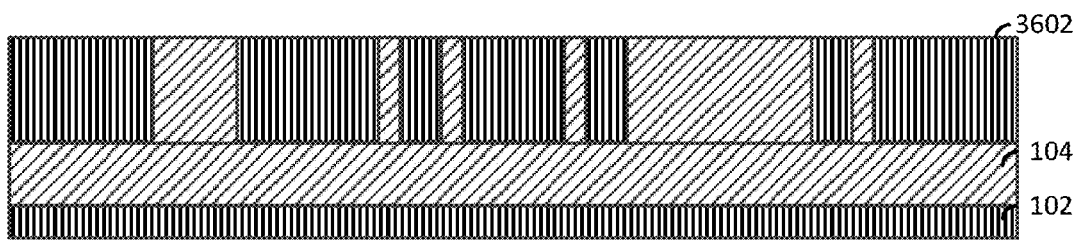
FIG. 36A illustrates a cut-away view along the line A-A (of FIG. 36B) following a planarization process.
Figure 36B:
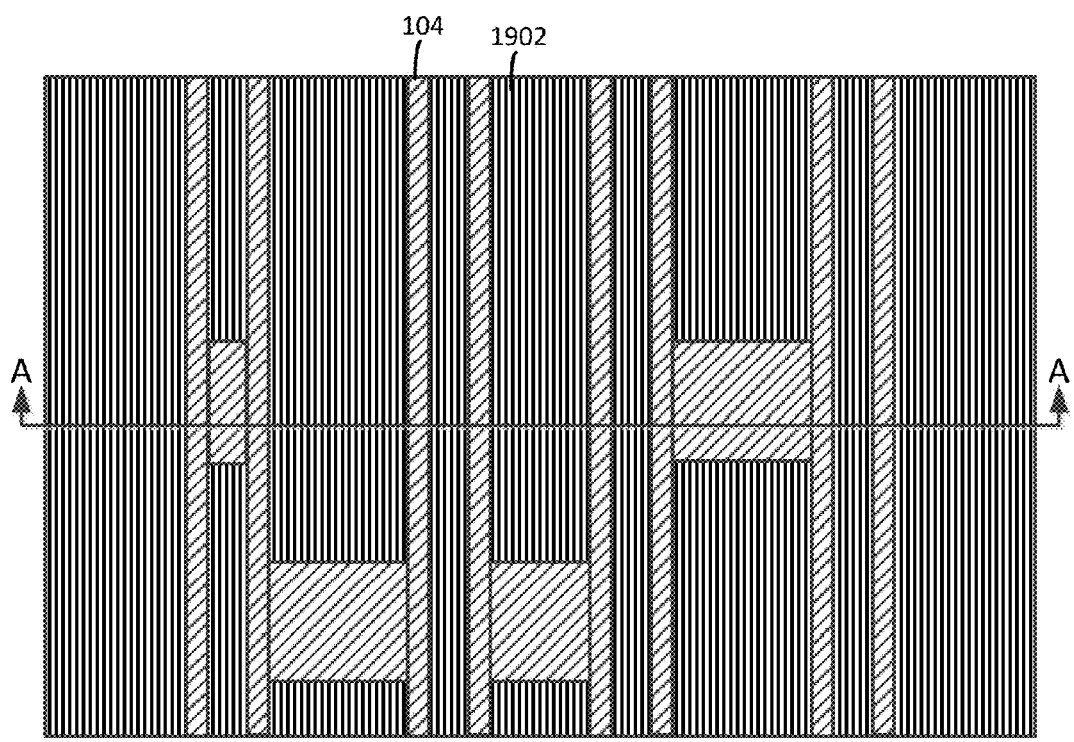

FIG. 36A illustrates a cut-away view along the line A-A (of FIG. 36B) following a planarization process. The planarization process such as, for example, chemical mechanical polishing may be performed to remove overburden material and form conductive lines 3602. Prior to depositing the conductive material, a liner layer (not shown) may be formed. FIG. 36B illustrates a top view of the resultant structure following the formation of the conductive lines 3602.

FIGS. 37A-59B illustrate another exemplary embodiment of a method for forming conductive lines for a semiconductor device.

Figure 37A:
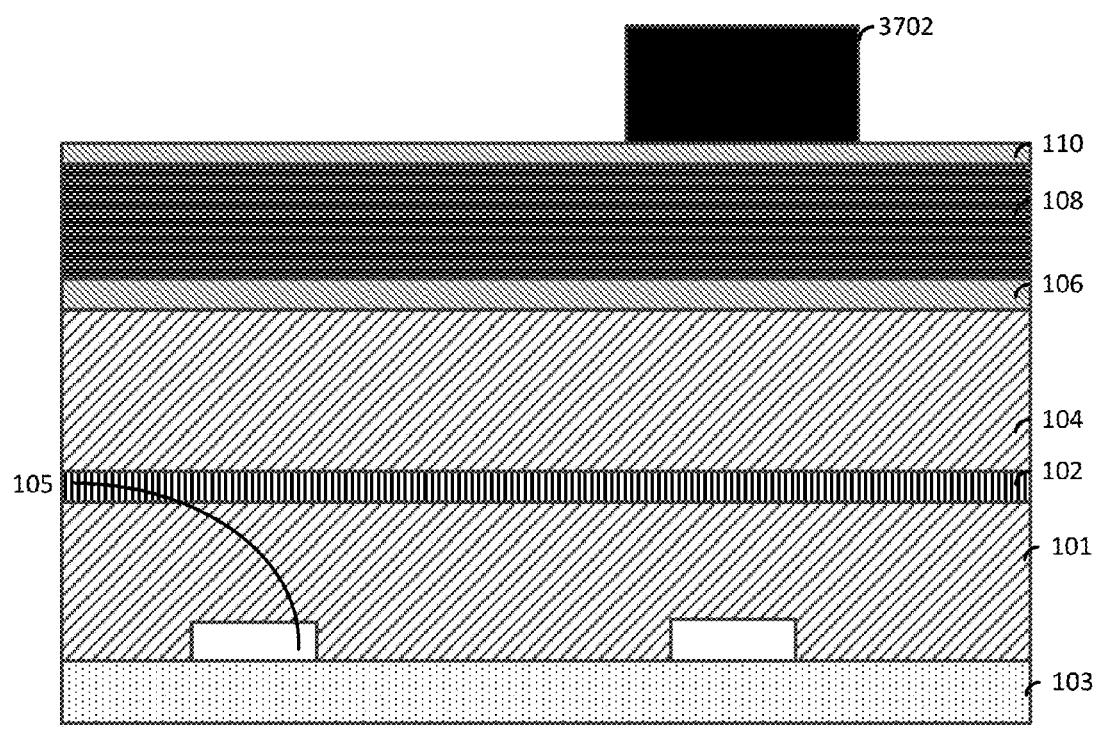

FIG. 37A illustrates a cut-away view along the line A-A (of FIG. 37B) of a structure formed on a substrate 103 that is similar to the structure described above in FIG. 1. Semiconductor devices 105 are arranged on the substrate 103, a layer of insulating material 101 is arranged on the semiconductor devices 105 and the substrate 103. A conductive line 102 is arranged on the layer of insulating material 101. An inter-level dielectric layer (insulator layer) 104 is arranged on the conductive line 102. A first hardmask 106 is arranged on the inter-level dielectric layer 104. An organic planarization layer 108 is arranged on the first hardmask 106 and a second hardmask 110 is arranged on the organic planarization layer 108.

Figure 37B:
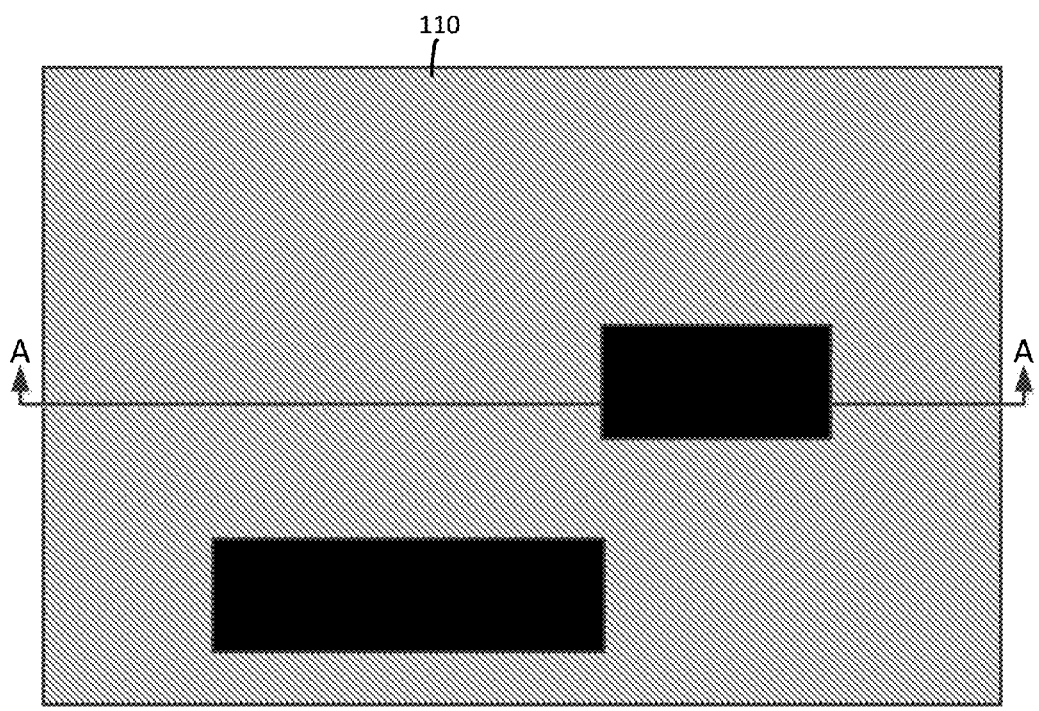
FIG. 37B illustrates a top view of the mask.

A mask 3702 is patterned on the second hardmask 110. Suitable masks include photoresists, electron-beam resists, ion-beam resists, X-ray resists and etch resists. The resist may a polymeric spin on material or a polymeric material. FIG. 37B illustrates a top view of the resist 114 arranged on the second hardmask 110.

FIG. 37B illustrates a top view of the mask 3702.

Figure 38:
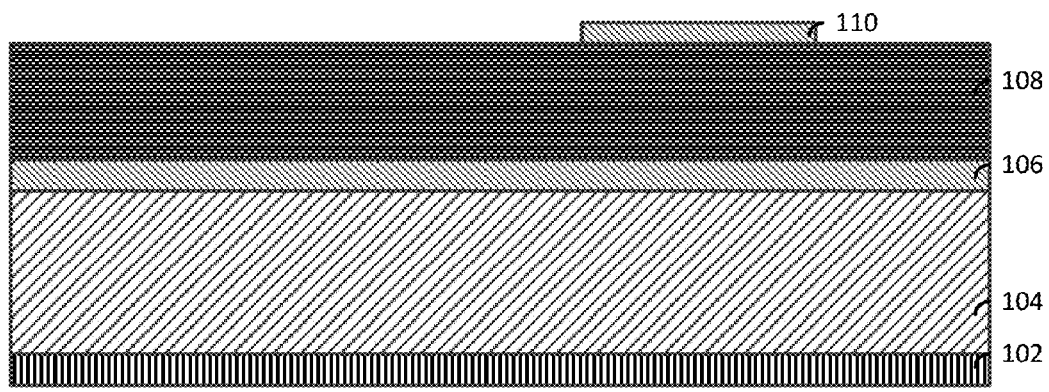

FIG. 38 illustrates a cut-away view following a selective anisotropic etching process that removes exposed portions of the second hardmask 110 to expose portions of the underlying organic planarization layer 108.

Figure 39A:
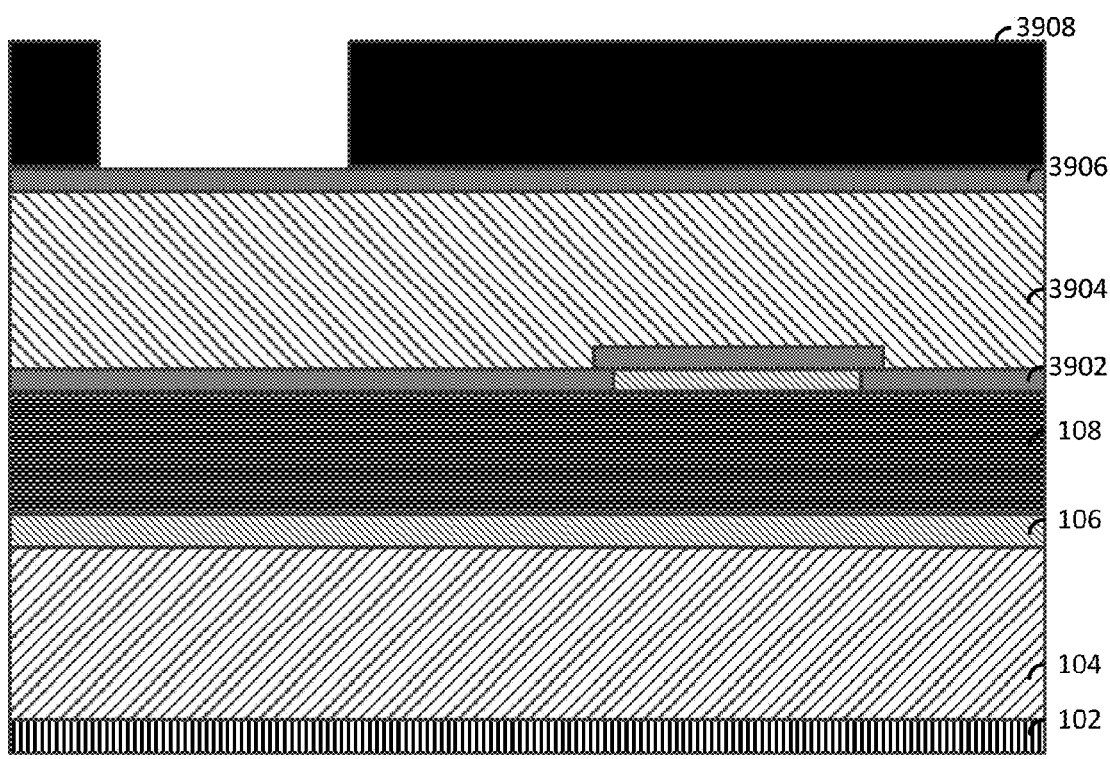
FIG. 39A illustrates a cut-away view along the line A-A (of FIG. 39B) following the deposition of a third hardmask.
Figure 39B:
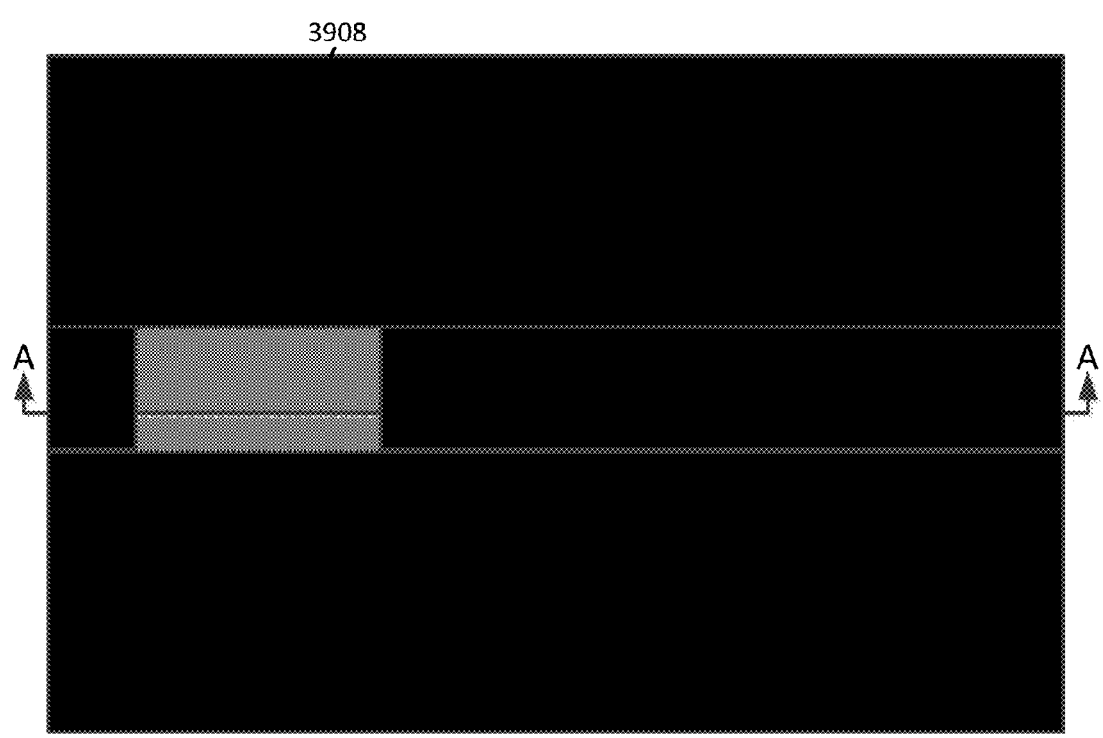
FIG. 39B illustrates a top view of the photolithographic mask patterned on the fourth hardmask.

FIG. 39A illustrates a cut-away view along the line A-A (of FIG. 39B) following the deposition of a third hardmask 3902 followed by the deposition of a layer of sacrificial mandrel material 3904 over the third hardmask 3902. A fourth hardmask 3906 is arranged on the layer of sacrificial mandrel material 3904. A photolithographic mask 3908 is patterned on the fourth hardmask 3906. FIG. 39B illustrates a top view of the photolithographic mask 3908 patterned on the fourth hardmask 3906.

Figure 40:
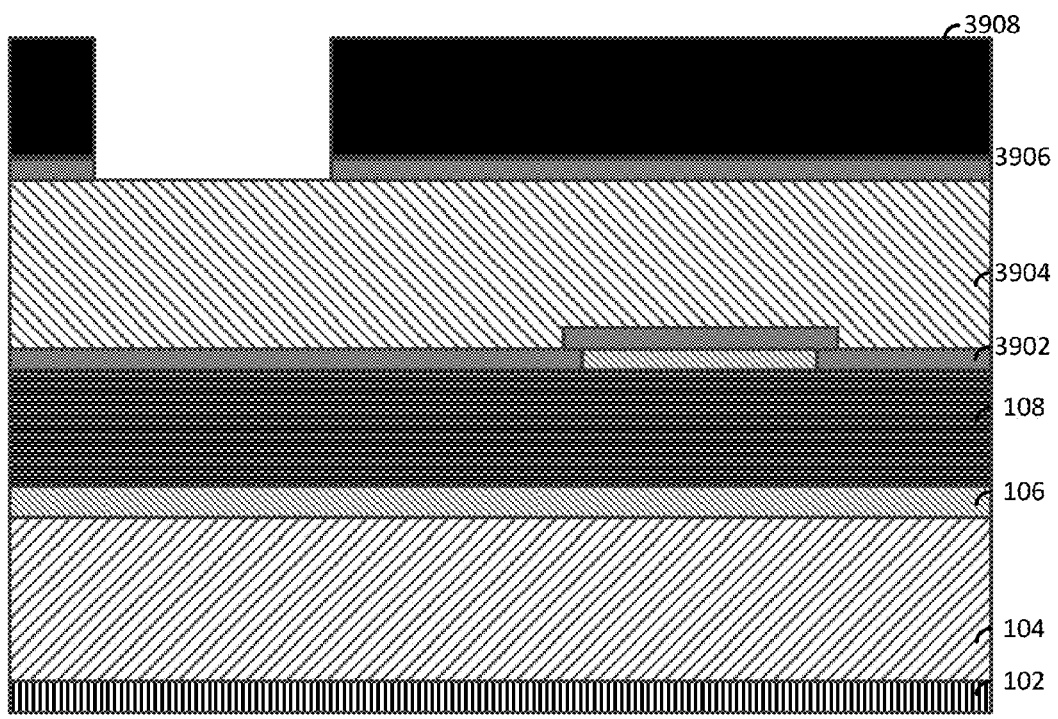

FIG. 40 illustrates a cut-away view following a selective etching process that removes exposed portions of the fourth hardmask 3906 to expose portions of the layer of sacrificial mandrel material 3904. The etching process may include, for example, reactive ion etching.

Figure 41A:
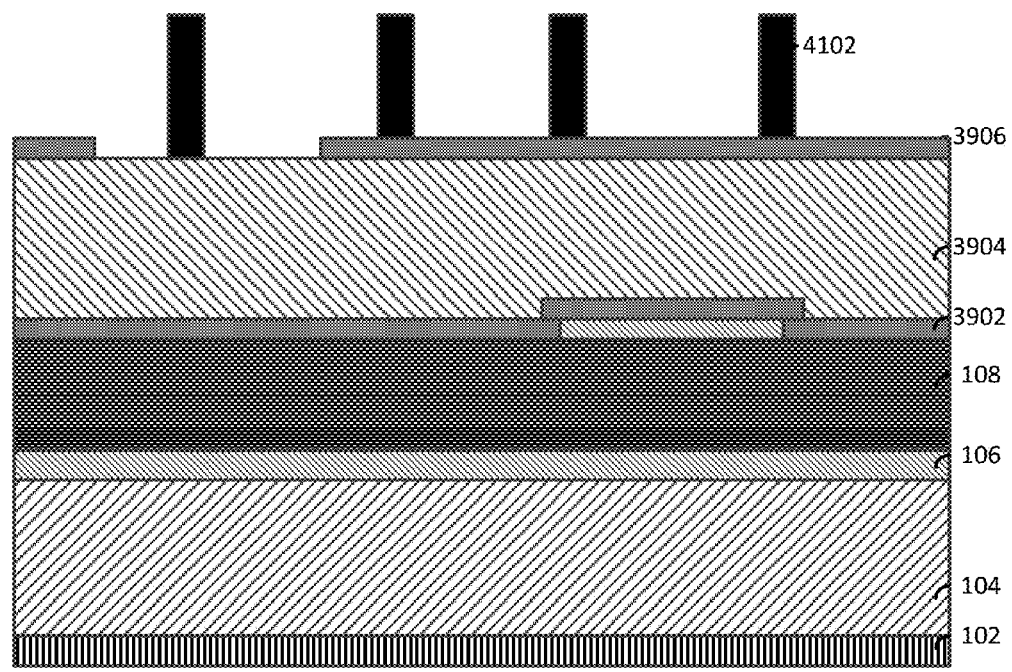
FIG. 41A illustrates a cut-away view along the line A-A (of FIG. 41B) following the removal of the photolithographic mask.
Figure 41B:
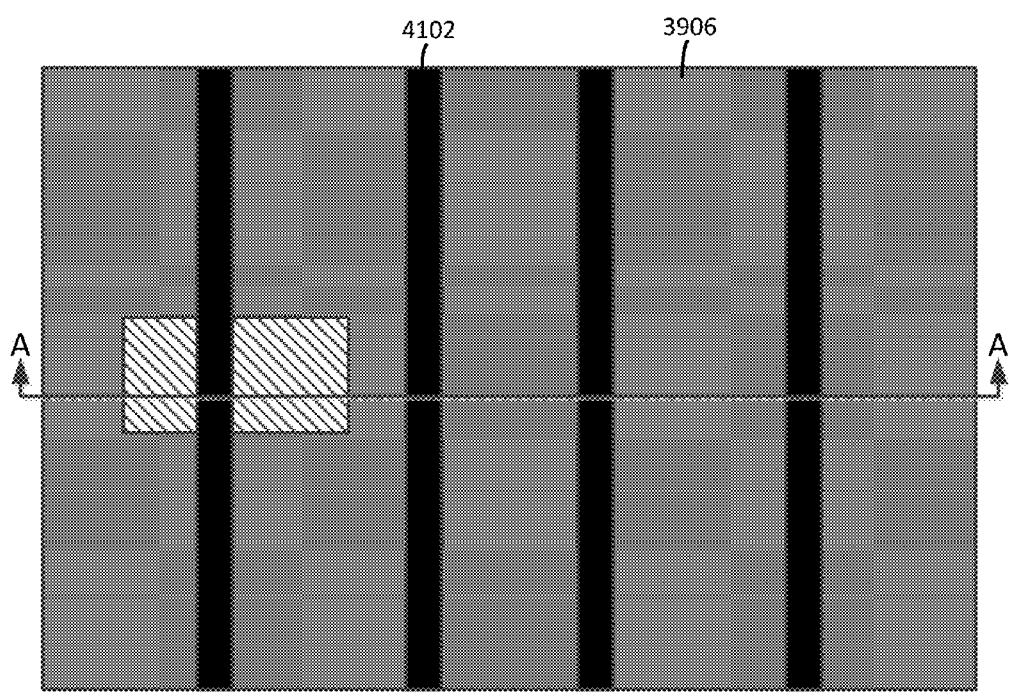
FIG. 41B illustrates a top view of the mask.

FIG. 41A illustrates a cut-away view along the line A-A (of FIG. 41B) following the removal of the photolithographic mask 3908 and the patterning of a mask 4102 over portions of the fourth hardmask 3906 and the sacrificial mandrel material 3904. FIG. 41B illustrates a top view of the mask 4102.

Figure 42:
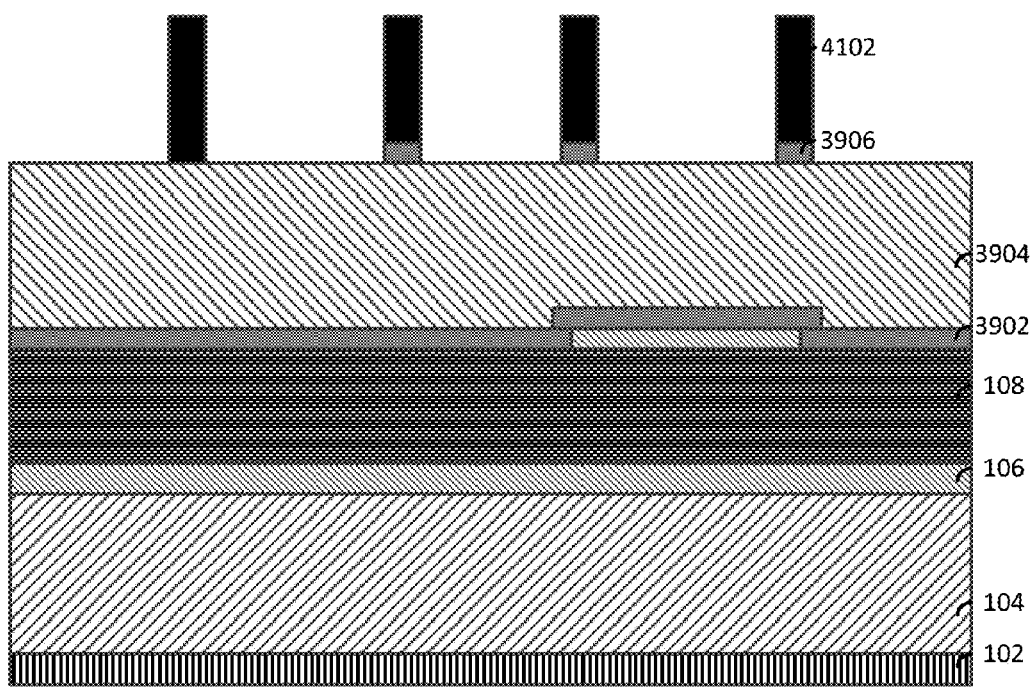

FIG. 42 illustrates a cut-away view following a selective etching process that removes exposed portions of the fourth hardmask 3906. The etching process may include, for example, reactive ion etching.

Figure 43A:
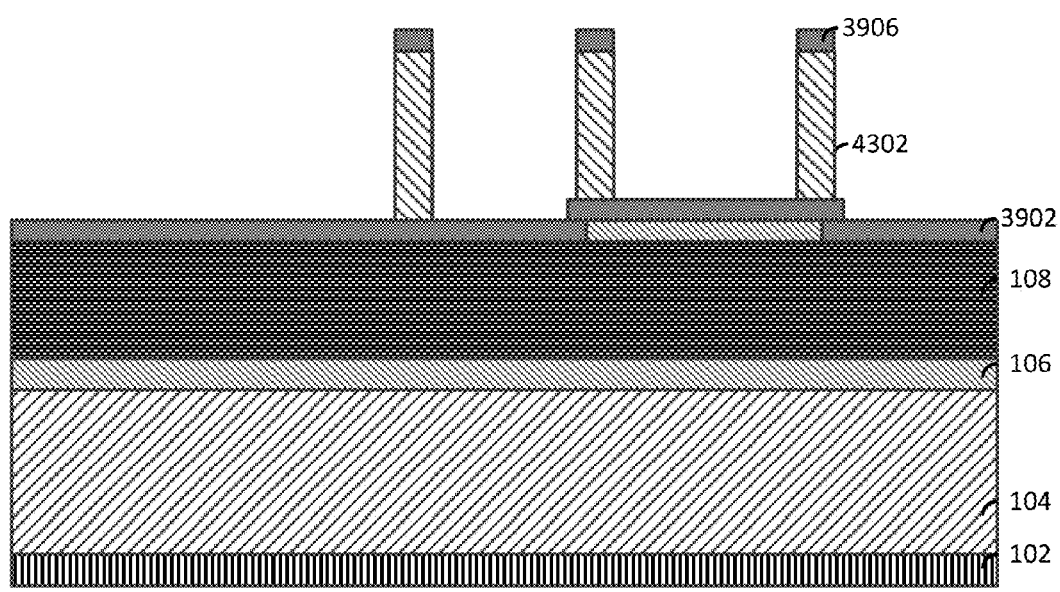
FIG. 43A illustrates a cut-away view along the line A-A (of FIG. 43B) following a selective anisotropic etching process.
Figure 43B:
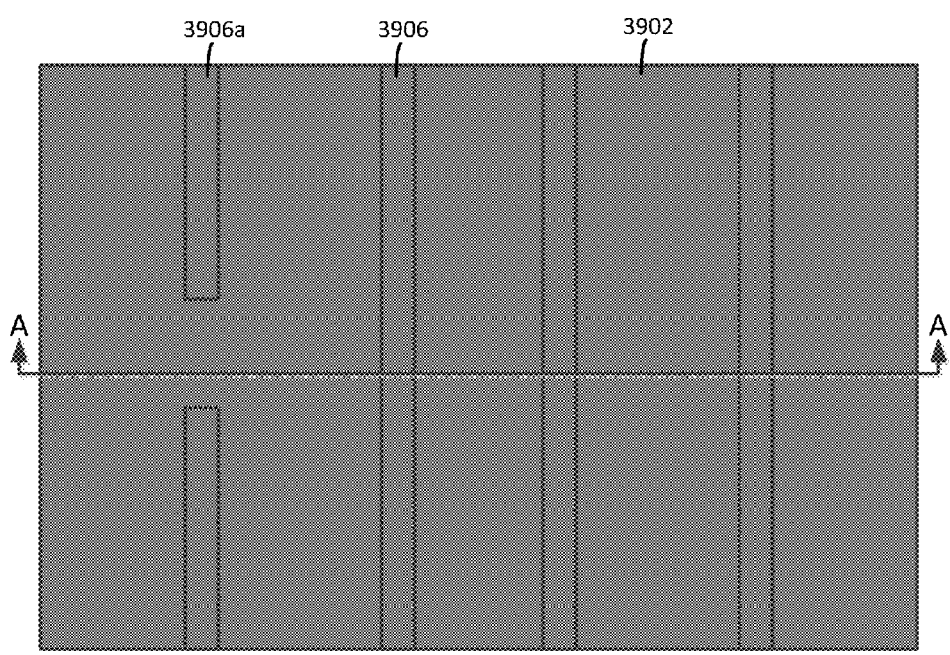
FIG. 43B illustrates a top view following the formation of the sacrificial mandrels.

FIG. 43A illustrates a cut-away view along the line A-A (of FIG. 43B) following a selective anisotropic etching process that removes exposed portions of the forth hardmask 3906 and removes exposed portions of the layer of sacrificial mandrel material 3904 to expose portions of the third hardmask 3902. The removal of portions of the layer of sacrificial mandrel material 3904 (of FIG. 42) results in the formation of sacrificial mandrels 4302. FIG. 43B illustrates a top view following the formation of the sacrificial mandrels 4302.

Figure 44A:
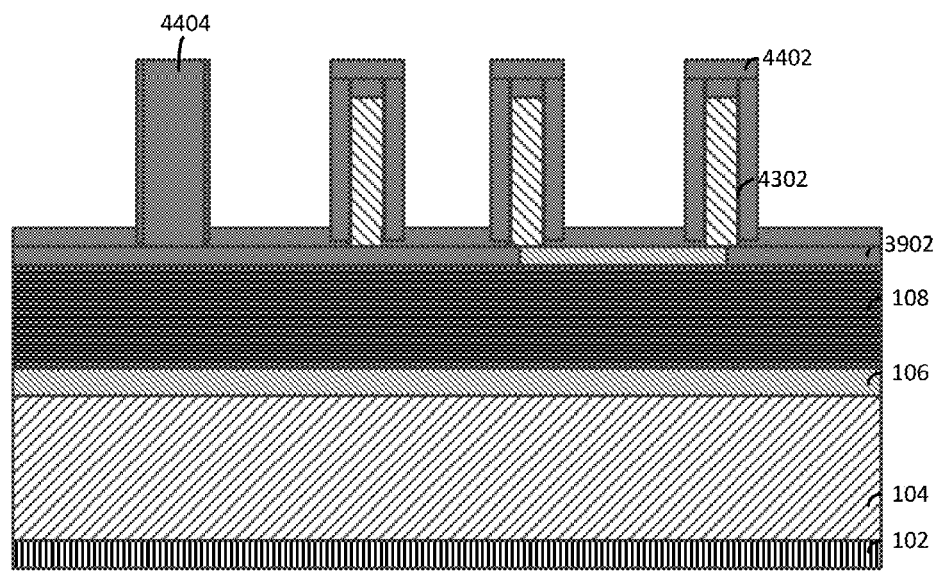
FIG. 44A illustrates a cut-away view along the line A-A (of FIG. 44B) following the deposition of a layer of spacer material.
Figure 44B:
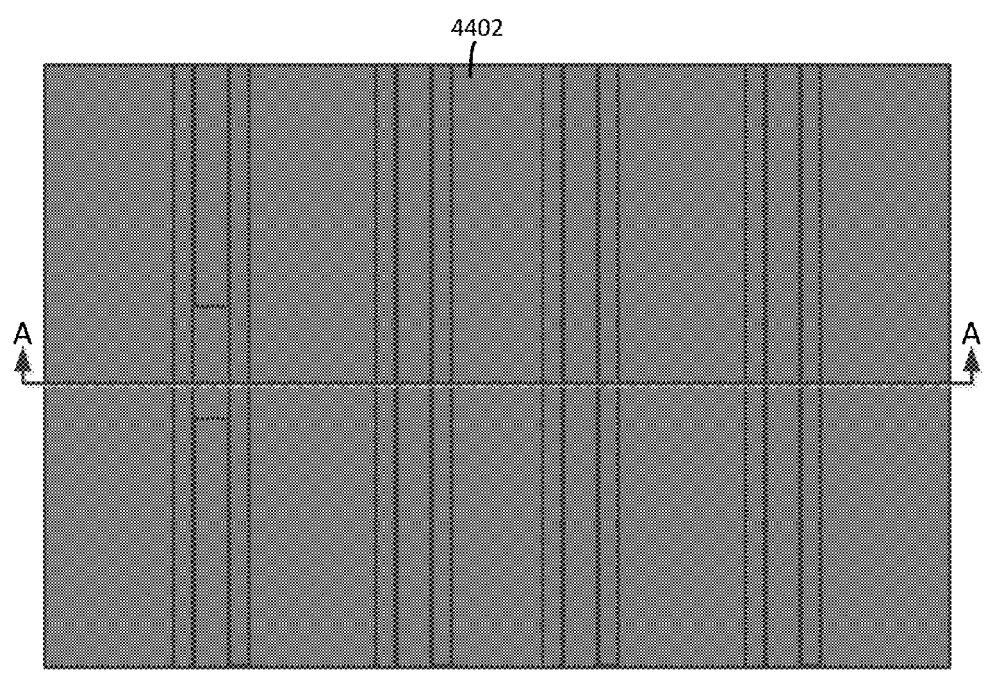
FIG. 44B illustrates a top view of the layer of spacer material.

FIG. 44A illustrates a cut-away view along the line A-A (of FIG. 44B) following the deposition of a layer of spacer material 4402 over exposed portions of the third hardmask 3902, the second hardmask 110, and the sacrificial mandrels 4302. FIG. 44B illustrates a top view of the layer of spacer material 4402.

Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

The deposition of the layer of spacer material 4402 results in a spacer "pinch off" region 4404 that is formed by a gap patterned in the sacrificial mandrel 3906a (of FIG. 43B).

Figure 45:
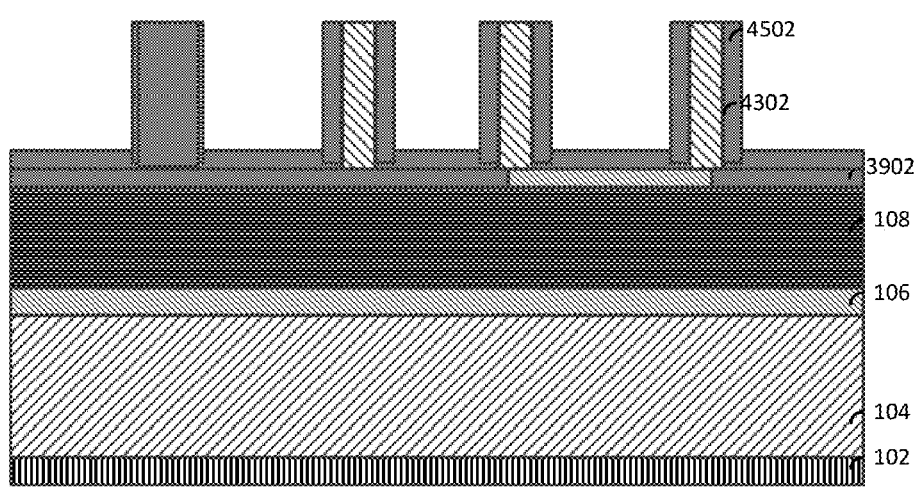

FIG. 45 illustrates a cut-away view following the formation of spacers 4502 along sidewalls of the sacrificial mandrels 4302. A suitable anisotropic etching process such as, for example, a reactive ion etching process is performed to remove portions of the layer of spacer material and form the spacers 4502.

Figure 46:
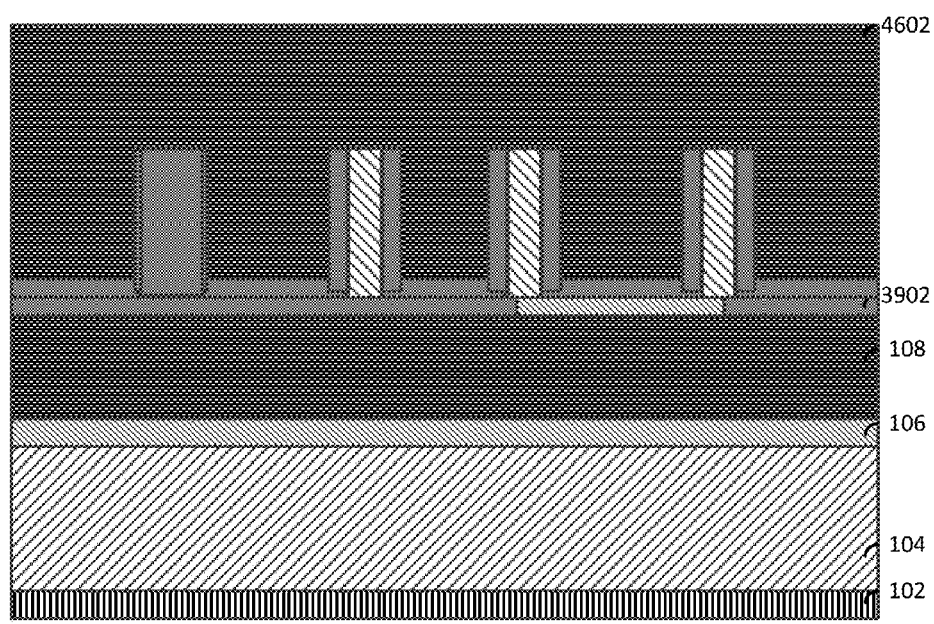

FIG. 46 illustrates a cut-away view following the deposition of another organic planarizing layer 4602 over portions of the spacers 4502.

Figure 47:
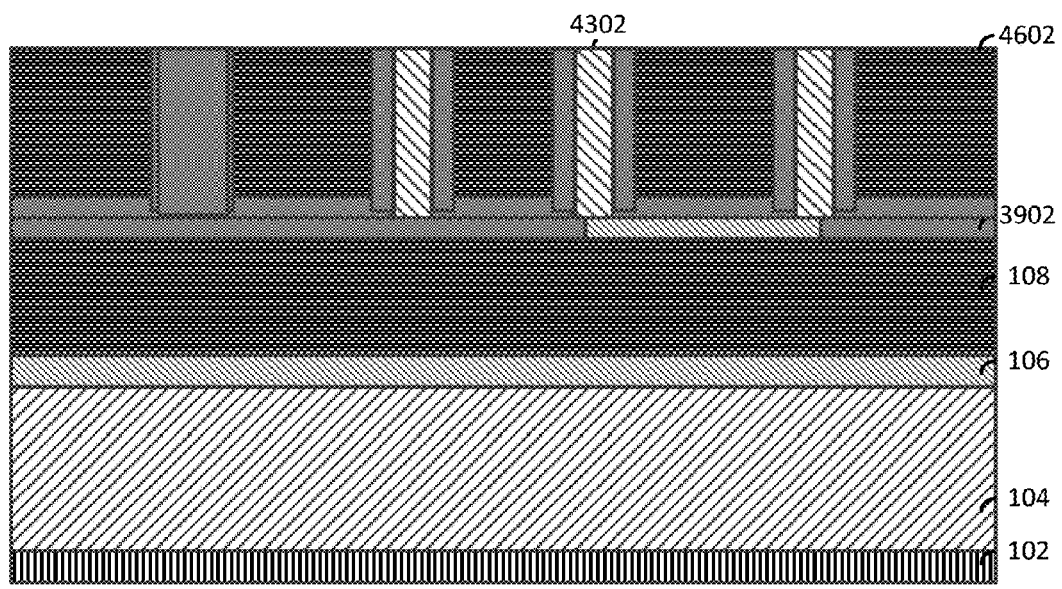

FIG. 47 illustrates a cut-away view following the removal of portions of the organic planarizing layer 4602 to expose portions of the sacrificial mandrels 4302.

Figure 48:
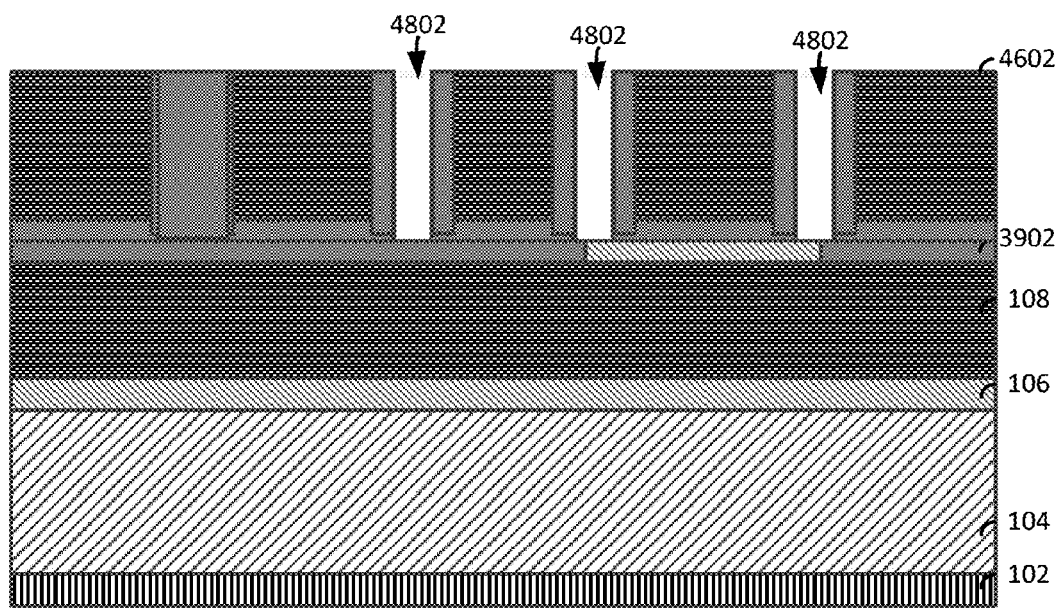

FIG. 48 illustrates a cut-away view following the removal of the sacrificial mandrels 4302 (of FIG. 47) to exposed underlying portions of the third hardmask 3902 and portions of the second hardmask 110. The sacrificial mandrels 4302 may be removed using a suitable selective anisotropic etching process such as, for example, reactive ion etching, which forms cavities 4802.

Figure 49:
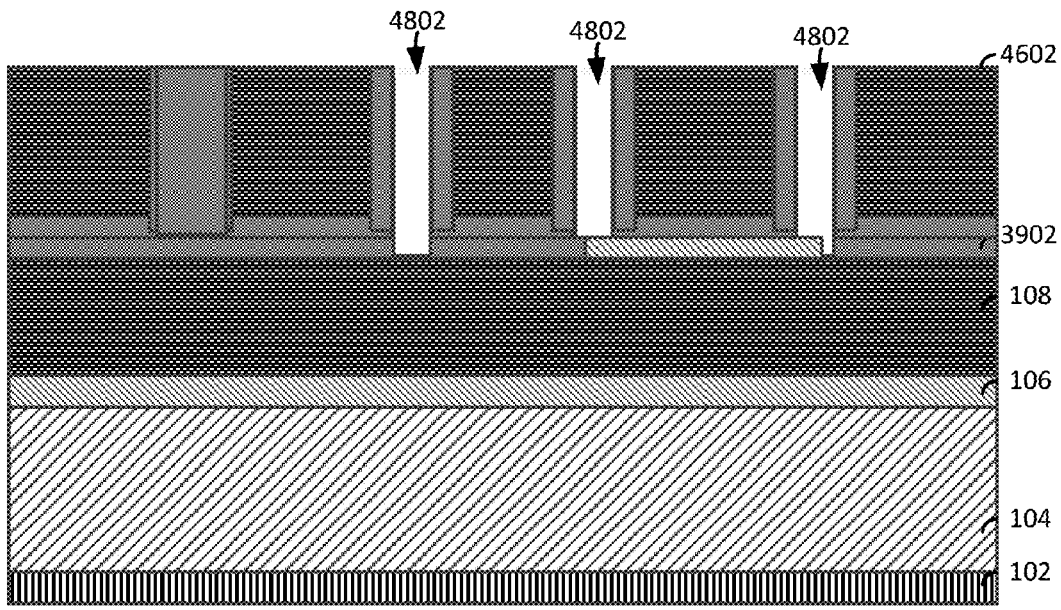

FIG. 49 illustrates a cut-away view following a selective anisotropic etching process that removes exposed portions of the third hardmask 3902 to expose portions of the second hardmask 110 and the organic planarizing layer 108.

Figure 50:
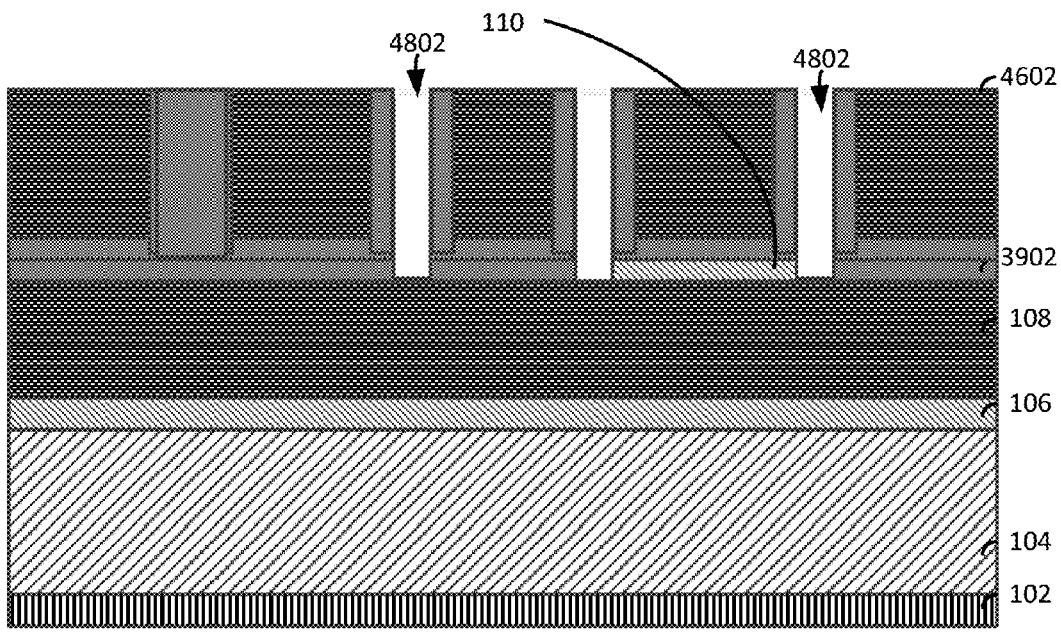

FIG. 50 illustrates a cut-away view of the resultant structure following a selective etching process that removes exposed portions of the second hardmask 110. The selective etching process may include, for example, reactive ion etching.

Figure 51:
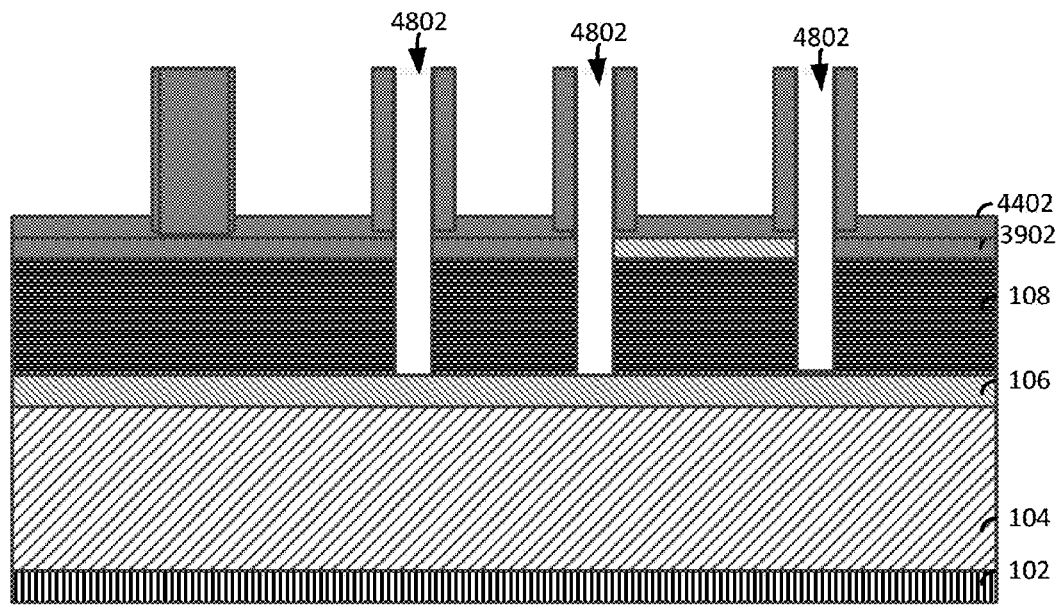

FIG. 51 illustrates a cut-away view following a selective etching process that removes exposed portions of the organic planarizing layer 4602 (of FIG. 50) and the organic planarizing layer 108. The etching process may include, for example, a reactive ion etching process that increases the depth of the cavities 4802.

Figure 52:
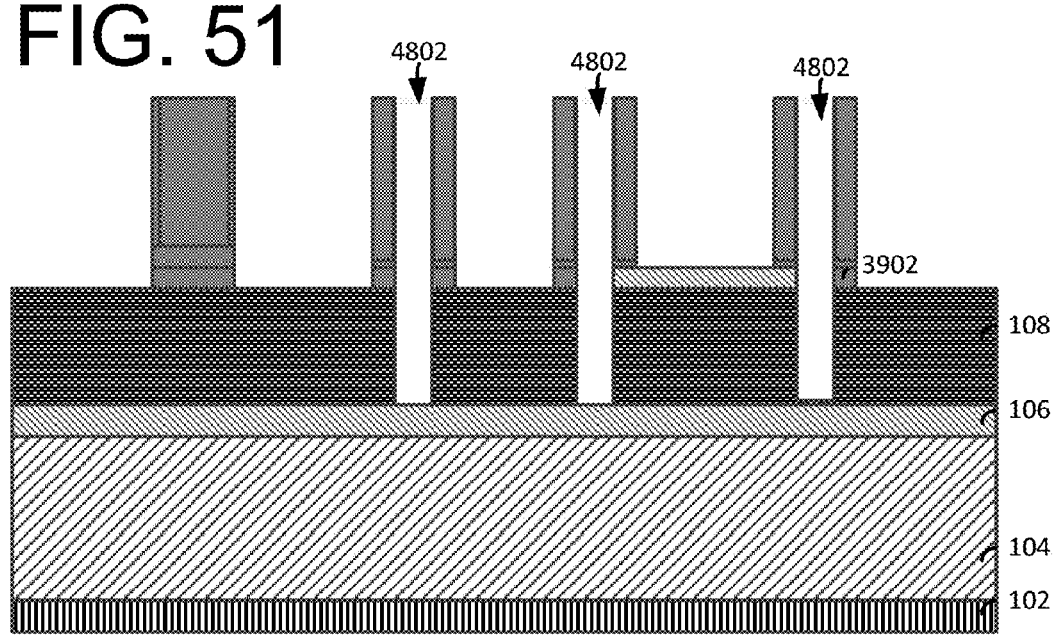

FIG. 52 illustrates a cut-away view following another selective etching process that removes portions of the layer of spacer material 4402 (of FIG. 51) and the third hardmask 3902 to expose portions of the organic planarizing layer 108. The selective etching process may include, for example, reactive ion etching.

Figure 53:
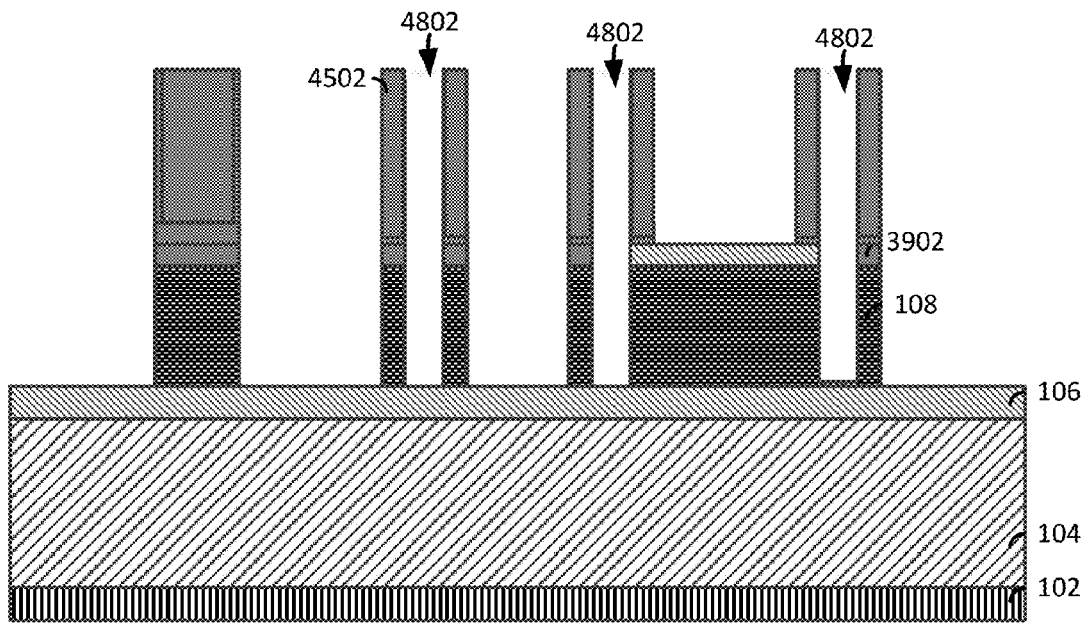

FIG. 53 illustrates a cut-away view following a selective etching process such as, for example, reactive ion etching. The etching process removes exposed portions of the organic planarizing layer 108 to expose portions of the first hardmask 106.

Figure 54:
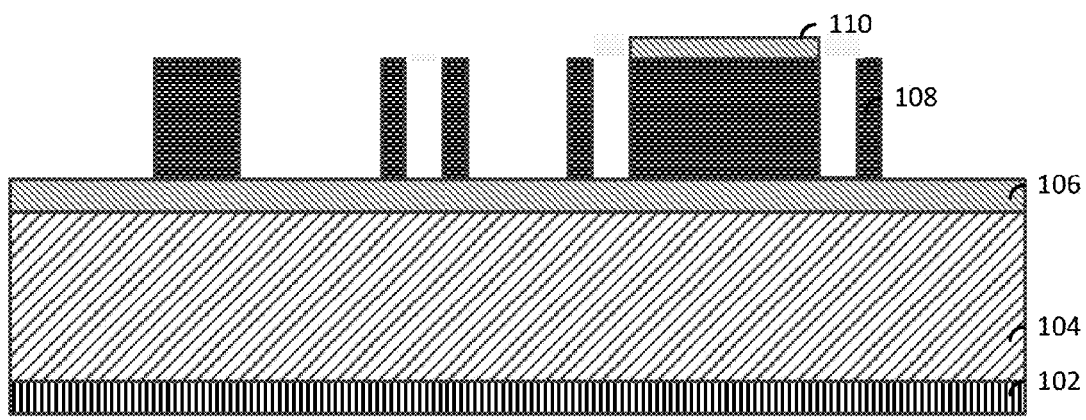

FIG. 54 illustrates a cut-away view following the removal of the spacers 4502.

Figure 55:
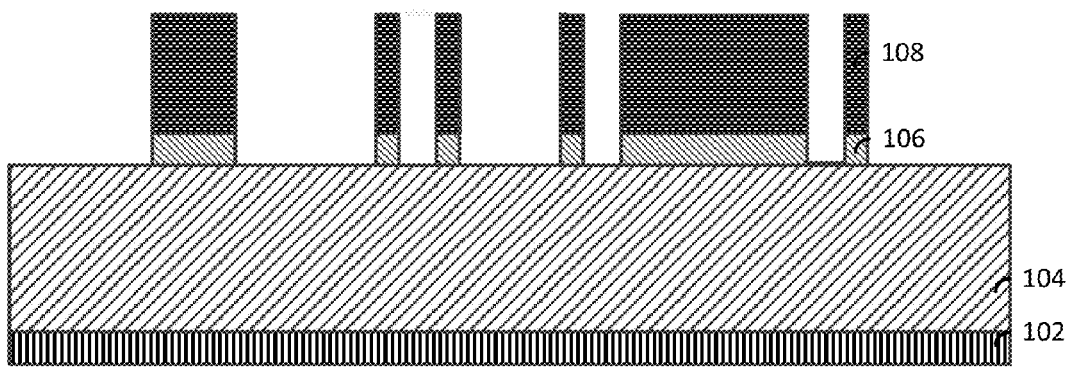

FIG. 55 illustrates a cut-away view following a selective etching process that removes exposed portions of the second hardmask 110 (of FIG. 54) and the first hardmask 106 to expose portions of the inter-level dielectric layer 104. The selective etching process may include, for example, reactive ion etching.

Figure 56:
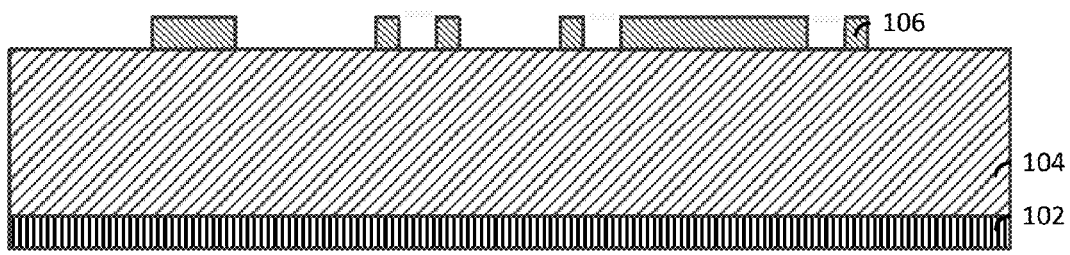

FIG. 56 illustrates a cut-away view following the removal of exposed portions of the organic planarizing layer 108 to expose the first hardmask 106.

Figure 57:
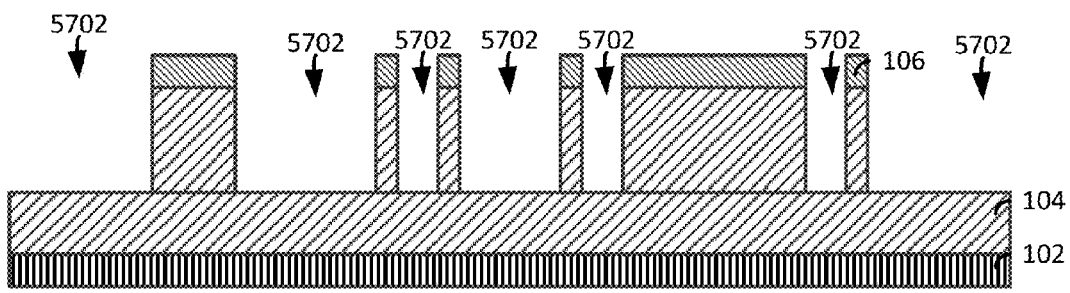

FIG. 57 illustrates a cut-away view following a selective etching process such as, for example, reactive ion etching. The etching process forms cavities (trenches) 5702 by removing exposed portions of the inter-level dielectric layer 104.

Figure 58:
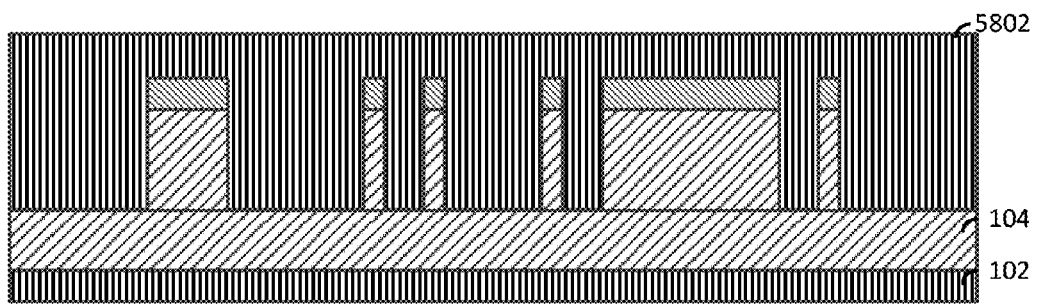

FIG. 58 illustrates a cut-away view following the deposition of a conductive material 5802 such as, for example, copper, silver, gold, aluminum, or another conductive material into the trenches 5702 (of FIG. 57).

Figure 59A:
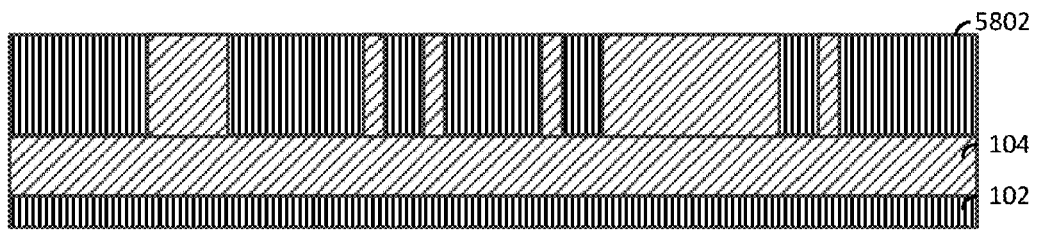
FIG. 59A illustrates a cut-away view along the line A-A (of FIG. 59B) following a planarization process.
Figure 59B:
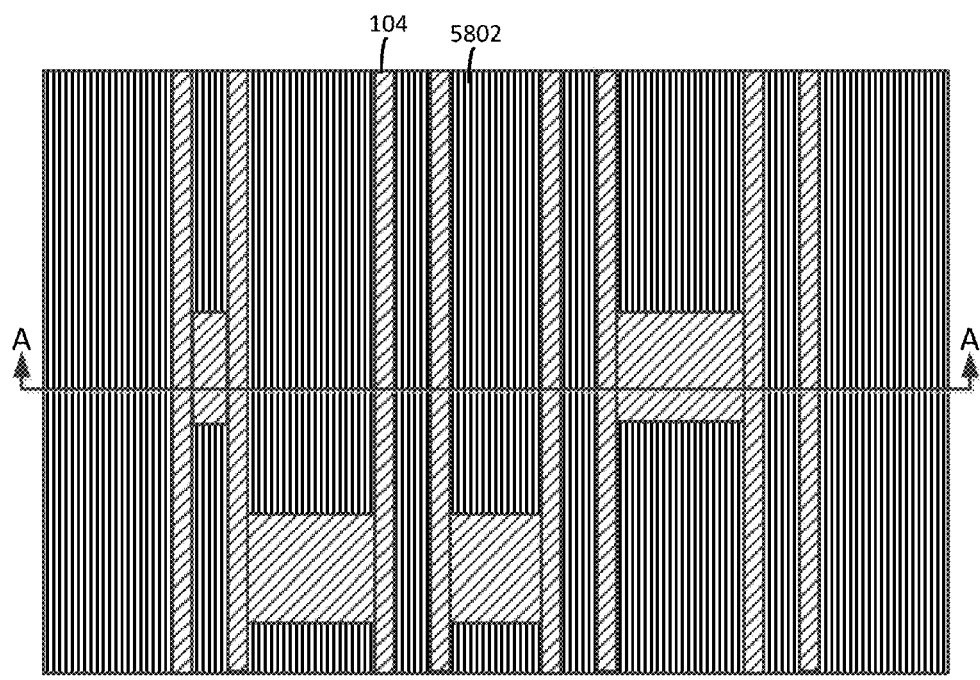

FIG. 59A illustrates a cut-away view along the line A-A (of FIG. 59B) following a planarization process. The planarization process such as, for example, chemical mechanical polishing may be performed to remove overburden material and form conductive lines 5802. Prior to depositing the conductive material, a liner layer (not shown) may be formed. FIG. 59B illustrates a top view of the resultant structure following the formation of the conductive lines 5802.

The embodiments described herein provide for the formation of mandrel lines and non-mandrel lines that are formed from dissimilar materials, and thus, may be selectively etched. The selectively of the mandrel and non-mandrel lines provides for selectively forming conductive lines in the regions defined by the mandrel and non-mandrel lines.

The embodiments described herein provide for patterning mandrels and non-mandrel lines on the substrate. Such embodiments allow for substantially self-aligning conductive lines with a greater margin of alignment error when patterning using a mask. The greater margin of error in mask alignment allows conductive lines to be formed as the pitch scale of the devices decreases.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming conductive lines on a semiconductor wafer, the method comprising:
    forming a first hardmask on an insulator layer, a planarizing layer on the first hardmask, a second hardmask on the planarizing layer and a layer of sacrificial mandrel material on the second hardmask;
    patterning a mask on the layer of sacrificial material;
    removing a portion of the mask;
    removing exposed portions of the layer of sacrificial mandrel material to expose portions of the second hardmask and form a first sacrificial mandrel and a second sacrificial mandrel on the second hardmask, wherein the first sacrificial mandrel has a gap defined by a first portion of the first sacrificial mandrel and a second portion of the first sacrificial mandrel;
    depositing a filler material on the second hardmask between the first sacrificial mandrel and the second sacrificial mandrel;
    removing a portion of the filler material between the first sacrificial mandrel and the second sacrificial mandrel to expose a portion of the second hardmask;
    removing an exposed portion of the second hardmask and an exposed portion of the planarizing layer to form a cavity that exposes a portion of the first hardmask;
    removing the filler material;
    depositing a layer of spacer material in the gap, the cavity, and over exposed portions of the first sacrificial mandrel, the second sacrificial mandrel and the first hardmask;
    removing portions of the layer of spacer material to form spacers adjacent to the first sacrificial mandrel and the second sacrificial mandrel, and expose portions of the second hardmask;
    removing exposed portions of the second hardmask, the planarizing layer and the first hardmask to expose portions of the insulator layer;
    removing the second hardmask, the spacers, and the planarizing layer;
    removing exposed portions of the insulator layer to form a trench in the insulator layer; and
    filling the trench with a conductive material.

2. The method of claim 1, wherein the method further comprises depositing a liner layer in the trench prior to depositing the conductive material.

3. The method of claim 1, wherein the trench defines a conductive line.

4. The method of claim 1, wherein the sacrificial mandrel material, the spacers and the filler material are dissimilar materials.

5. The method of claim 1, wherein the spacers are formed from an oxide material.

6. The method of claim 1, wherein the layer of sacrificial mandrel material includes a semiconductor material.

7. The method of claim 1, wherein the filler material includes a flowable carbide material.

* * * * *